United States Patent
Terui et al.

(10) Patent No.: US 9,310,682 B2
(45) Date of Patent: Apr. 12, 2016

(54) POSITIVE-TYPE RESIST COMPOSITION

(75) Inventors: Yoshiharu Terui, Fujimi (JP); Takashi Mori, Palm Valley (CA); Haruhiko Komoriya, Iruma-gun (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

(21) Appl. No.: 14/127,392

(22) PCT Filed: Jun. 18, 2012

(86) PCT No.: PCT/JP2012/065460
§ 371 (c)(1),
(2), (4) Date: Dec. 18, 2013

(87) PCT Pub. No.: WO2012/176718
PCT Pub. Date: Dec. 27, 2012

(65) Prior Publication Data
US 2014/0134542 A1 May 15, 2014

(30) Foreign Application Priority Data

Jun. 21, 2011 (JP) ................................ 2011-137111
Jun. 13, 2012 (JP) ................................ 2012-133697

(51) Int. Cl.
*G03F 7/004* (2006.01)
*G03F 7/039* (2006.01)
*G03F 7/16* (2006.01)

(52) U.S. Cl.
CPC ............ *G03F 7/0392* (2013.01); *G03F 7/0045* (2013.01); *G03F 7/0046* (2013.01); *G03F 7/0048* (2013.01); *G03F 7/16* (2013.01)

(58) Field of Classification Search
CPC ..... G03F 7/004; G03F 7/0046; G03F 7/0048; G03F 7/027; G03F 7/028; G03F 7/039; G03F 7/0392
USPC ............................. 430/270.1, 281.1, 326, 910
See application file for complete search history.

(56) References Cited

U.S. PATENT DOCUMENTS

| | | | |
|---|---|---|---|
| 6,511,785 B1 * | 1/2003 | Takemura et al. ......... | 430/270.1 |
| 6,835,524 B2 | 12/2004 | Hatakeyama et al. | |
| 2001/0018162 A1 * | 8/2001 | Hatakeyama et al. ..... | 430/270.1 |
| 2002/0106580 A1 | 8/2002 | Nitta et al. | |
| 2007/0254235 A1 | 11/2007 | Allen et al. | |
| 2009/0226672 A1 | 9/2009 | Meador et al. | |
| 2010/0035185 A1 | 2/2010 | Hagiwara et al. | |
| 2010/0173245 A1 * | 7/2010 | Wang et al. ................ | 430/270.1 |
| 2011/0008728 A1 | 1/2011 | Nakamura et al. | |
| 2012/0148945 A1 * | 6/2012 | Hasegawa et al. ................ | 430/5 |

FOREIGN PATENT DOCUMENTS

| | | |
|---|---|---|
| CN | 101687781 A | 3/2010 |
| EP | 0 458 481 A2 | 11/1991 |
| JP | 4-229250 A | 8/1992 |
| JP | 2001-226432 A | 8/2001 |
| JP | 2002-179733 A | 6/2002 |
| JP | 2003-140348 * | 5/2003 |
| JP | 2007-256525 A | 10/2007 |
| JP | 2010-276969 A | 12/2010 |
| JP | 2011-80032 A | 4/2011 |
| KR | 2001-0082639 A | 8/2001 |
| KR | 2002-0039239 A | 5/2002 |
| WO | WO 2009/105556 A2 | 8/2009 |

OTHER PUBLICATIONS

Machine translation of JP 2003-140348, published on May 14, 2003.*
Corresponding International Search Report with English Translation dated Jul. 17, 2012 (three (3) pages).
Japanese-language Written Opinion dated Jul. 17, 2012 (PCT/ISA/237) (three (3) pages).
Japanese-language Korean Office Action issued in counterpart Korean Application No. 2014-7001387 dated Aug. 7, 2015 (Ten (10) pages).
Chinese-language Office Action issued in counterpart Chinese Application No. 201280030770.X dated Oct. 10, 2015 (Eight (8) pages).

* cited by examiner

*Primary Examiner* — Anca Eoff
(74) *Attorney, Agent, or Firm* — Crowell & Moring LLP

(57) ABSTRACT

A positive-type resist composition according to the present invention includes a fluorine-containing aliphatic alcohol, a polymer, a vinyl compound and a photoacid generator, wherein the fluorine-containing aliphatic alcohol is a monohydric $C_2$-$C_8$ aliphatic alcohol in which the number of hydrogen atoms is equal to or less than the number of fluorine atoms. This positive-type resist composition has a small influence on organic materials, such as less dissolution and swelling of the organic materials, and can form a resist film on an organic polymer substrate etc. by a wet application process such that the resulting resist film or resist pattern shows high solvent resistance.

12 Claims, No Drawings

POSITIVE-TYPE RESIST COMPOSITION

TECHNICAL FIELD

The present invention relates to a positive-type resist composition for resist patterning by lithography in manufacturing of semiconductor devices etc. More particularly, the present invention relates to a positive-type resist composition suitable for resist patterning on an organic polymer substrate or organic coated substrate.

BACKGROUND ART

It is common practice to conduct fine patterning by photolithography (hereinafter simply referred to as "lithography") in manufacturing of semiconductor devices. The lithography is a process of applying a film of a photosensitive material (called "photoresist"; hereinafter simply referred to as "resist") to a substrate, exposing the resist film to high-energy irradiation through a patterned photomask and transferring the resist onto a surface of the substrate according to the shape of the pattern of the photomask. In the lithography, the development of the resist is a technique of forming a fine resist pattern on the substrate due to a difference in developer solubility between exposed and unexposed portions of the resist film.

It is often the case to use inorganic substrates made of inorganic materials such as silicon single crystal in the lithography for manufacturing of semiconductor devices. However, there are cases that resist patterns are formed on organic materials such as organic polymer films, organic polymer substrates or organic coatings applied to substrates. It is herein noted that, in the present invention, the term "organic polymer substrates" refers to substrates made using, as raw materials, compounds (called "polymers") obtained by polymerization of organic molecules. Typical examples of the organic polymer substrates are those made from polyethylene terephthalate (hereinafter sometimes called "PET") as PET substrates.

In the case of forming resist films on such organic materials with the use of the same resist solvents as those commonly used for the application of resists by a wet application process to inorganic materials such as glass substrates, however, there occurs wetting of the organic materials, that is, swelling or dissolution of the organic materials by the solvent so that fine resist patterns cannot be formed on the organic materials due to loss of substrate surface uniformity.

As other processes for forming patterns on substrates, there are known a process using a photosensitive resist film, an ink jet process and the like.

The process using the photosensitive resist film is a process for forming a resist pattern by adhering the photosensitive resist film (hereinafter sometimes called "dry film resist") to a substrate and exposing the dry film resist to ultraviolet irradiation. The dry film resist is commercially available under the trade name of e.g. "SUNFORT" from Asahi Kasei E-Materials Corporation, "ALPHO" from Nichigo-Morton Co., Ltd. or the like. In the process using the photosensitive resist film, it is desirable to roughen a surface of the substrate by sandblasting etc., before adhering the dry film resist to the substrate, for the purpose of improving the adhesion of the dry film resist to the substrate. However, such roughening of the substrate surface becomes a cause of pattern accuracy deterioration in the case of laminating a plurality of resist films and repeating fine patterning. Further, the dry film resist is generally adhered to the substrate by heating the dry film resist. In the case of using an organic polymer substrate as the substrate, such heating of the dry film resist leads to a large difference between dimensional changes of the dry film resist and the substrate due to a difference in thermal expansion coefficient between the dry resist film and the substrate and thereby makes it difficult to conduct accurate positioning of the dry film resist and the substrate.

The ink jet process is a process for directly forming a pattern by ejecting droplets of ink etc. onto a substrate. As compared to the lithography, it is difficult and time-consuming by the ink jet process to form an accurate pattern on a large area for production of large-sized displays even though the ink jet process is useful for production of small-sized displays.

There have been researched resist compositions for the application of resist films by a wet application process onto low-solvent-resistant organic materials in the field of lithography.

For example, Patent Documents 1 to 3 each disclose a resist composition using, as a resist solvent, an ether, long-chain alcohol or fluorinated alcohol solvent that is less likely to cause swelling or dissolution of low-solvent-resistant organic materials. In Patent Documents 1 to 3, however, there are no considerations given to the solvent resistance of the resulting resist pattern so that the resist pattern does not show sufficient solvent resistance.

Further, it is conceivable to conduct double exposure for finer resist patterning. The double exposure is a technique of patterning a resist film on a substrate by photolithography, forming another resist film with the application of a resist solution on the resist pattern, and then, again patterning the resist film. In such double exposure, the solvent resistance of the resist pattern is particularly important.

Patent Document 4 proposes, as a technique for solvent resistance improvements of a resist film and a resist pattern, a process for obtaining a high-solvent-resistant pattern by forming a cross-linking structure in a resin film, exposing the resist film to high-energy irradiation such as ultraviolet irradiation or electron beam so as to cause cleavage of the cross-linking structure in exposed portions of the resin film, and then, developing the exposed portions by dissolving in a developer. In this proposed process, however, the solvent used is the same as those commonly used for inorganic substrates and is not of the kind that does not cause wetting of organic materials.

PRIOR ART DOCUMENTS

Patent Documents

Patent Document 1: Japanese Laid-Open Patent Publication No. 2001-226432
Patent Document 2: Japanese Laid-Open Patent Publication No. 2002-179733
Patent Document 3: Japanese Laid-Open Patent Publication No. 2010-276969
Patent Document 4: International Application Publication No. 2009/105556

SUMMARY OF THE INVENTION

Problems to be Solved by the Invention

In the case of forming a resist pattern on an organic material, e.g., organic polymer substrate by photolithography, there occurs swelling or dissolution of the organic polymer substrate by an organic solvent for the reason that the organic material is low in resistance to the organic solvent. This results in a problem such as transparency loss, shrinkage, surface erosion or surface profile change of the organic polymer substrate.

Under the above circumstances, there has been a demand for a resist composition having less influence on the organic material, such as dissolution or swelling of the organic material, and capable forming a resist film on the organic polymer substrate by a wet application process. There has also been a demand for a resist composition capable of forming a resist film or resist pattern with high solvent resistance on the substrate.

Means for Solving the Problems

The present invention provides a resist composition using, as a solvent, a fluorine-containing aliphatic alcohol that has a very small influence on organic materials, such as less swelling or dissolution of organic materials, and prepared by dissolving a specific combination of a polymer, a vinyl compound and an photoacid generator into the fluorine-containing aliphatic alcohol.

In the case of a solvent with less influence on organic materials, the capability of the solvent to dissolve therein resist materials such as a polymer and a vinyl compound is generally small. It is thus difficult to use such a solvent in a resist composition (resist solution).

The present inventors have however found that: a fluorine-containing aliphatic alcohol with less influence on organic materials can dissolve therein a specific kind of polymer; and a positive-type resist composition, when prepared by dissolving such a polymer in combination with a specific vinyl compound into the fluorine-containing aliphatic alcohol and adding thereto a photoacid generator, has less influence on organic materials and can form a resist film on an organic polymer substrate by a wet application process such that the resulting resist film or resist pattern shows high solvent resistance.

In the present invention, the positive-type resist composition has a so-called positive resist function of forming a fine resist pattern on an organic polymer substrate by applying a resist film through thermal curing of the specific polymer and the specific vinyl compound, irradiating the resist film with high-energy irradiation so as to generate an acid from the photoacid generator in irradiated portions of the resist film and thereby cleave bonds in the cross-linking structure of the resist film, which has been created during the thermal curing of the specific polymer and the specific vinyl compound, and then, dissolving the irradiated portions of the resist film in a developer.

The fluorine-containing aliphatic alcohol used as the solvent in the positive-type resist composition has a small capability to dissolve therein many organic materials and thus does not erode organic materials such as organic polymer films, organic polymer substrates and organic coated substrates. Further, the fluorine-containing aliphatic alcohol can dissolve therein a sufficient amount of photoacid generator for resist photosensitivity.

In other words, the present invention includes the following aspects 1 to 8.

[Inventive Aspect 1]

A positive-type resist composition, comprising:
a fluorine-containing monohydric $C_2$-$C_8$ aliphatic alcohol in which the number of hydrogen atoms is equal to or less than the number of fluorine atoms;
a polymer having a repeating unit A of the following general formula (1) and a repeating unit B of the following general formula (2);
a vinyl compound; and
a photoacid generator,

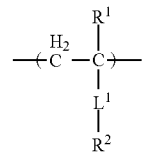

where $R^1$ represents a hydrogen atom, a fluorine atom, or a $C_1$-$C_3$ alkyl group in which a part or all of hydrogen atoms may be substituted with a fluorine atom or a chlorine atom; $R^2$ represents a $C_1$-$C_{15}$ straight or $C_3$-$C_{15}$ branched hydrocarbon group in which a part of carbon atoms may be replaced by an oxygen atom and in which a part or all of hydrogen atoms may be substituted with a fluorine atom or a chlorine atom; and $L^1$ represents a single bond, an oxygen atom, —$CH_2$—O—, —C(=O)—, —C(=O)—O— or —O—C(=O)—

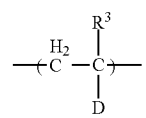

where $R^3$ represents a hydrogen atom, a fluorine atom, or a $C_1$-$C_3$ alkyl group in which a part or all of hydrogen atoms may be substituted with a fluorine atom or a chlorine atom; D represents a group of the following general formula (3) or a group of the following general formula (4)

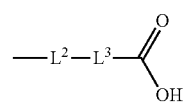

where $L^2$ represents a single bond, an oxygen atom, —$CH_2$—O—, —C(=O)—, —C(=O)—O— or —O—C(=O)—; $L^3$ represents a single bond, or a divalent $C_1$-$C_{15}$ straight or $C_3$-$C_{15}$ branched hydrocarbon group in which a part of carbon atoms may be replaced by an oxygen atom and in which a part or all of hydrogen atoms may be substituted with a fluorine atom or a chlorine atom; and a carboxyl group may be protected with a protecting group

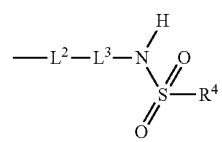

where $R^4$ represents a $C_1$-$C_8$ alkyl group in which a part or all of hydrogen atoms may be substituted with a fluorine atom or a chlorine atom; $L^2$ represents a single bond, an oxygen atom, —$CH_2$—O—, —C(=O)—, —C(=O)—O— or —O—C(=O)—; $L^3$ represents a single bond, or a $C_1$-$C_{15}$ straight or $C_3$-$C_{15}$ branched divalent hydrocarbon group in which a part of carbon atoms may be replaced by an oxygen atom and in which a part or all of hydrogen atoms may be substituted with a fluorine atom or a chlorine atom; and an alkylsulfoneamide group may be protected with a protecting group.

[Inventive Aspect 2]

The positive-type resist composition according to Inventive Aspect 1, wherein, in the general formula (2), D is a group of the following general formula (5)

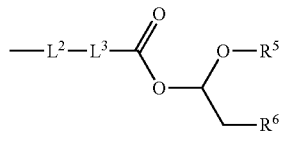

(5)

where $R^5$ represents a $C_1$-$C_{15}$ straight, $C_3$-$C_{15}$ branched or $C_6$-$C_{15}$ cyclic hydrocarbon group in which a part or all of hydrogen atoms may be substituted with a fluorine atom or a chlorine atom; $R^6$ represents a hydrogen atom, or a $C_1$-$C_{15}$ straight, $C_3$-$C_{15}$ branched or $C_6$-$C_{15}$ cyclic hydrocarbon group in which a part or all of hydrogen atoms may be substituted with a fluorine atom or a chlorine atom; $R^5$ and $R^6$ may be bonded together to form a ring structure; $L^2$ represents a single bond, an oxygen atom, —$CH_2$—O—, —C(=O)—, —C(=O)—O— or —O—C(=O)—; and $L^3$ represents a single bond, or a $C_1$-$C_{15}$ straight or $C_3$-$C_{15}$ branched divalent hydrocarbon group in which a part of carbon atoms may be replaced by an oxygen atom and in which a part or all of hydrogen atoms may be substituted with a fluorine atom or a chlorine atom.

[Inventive Aspect 3]

The positive-type resist composition according to Inventive Aspect 1, wherein, in the general formula (2), D is a group of the following general formula (6)

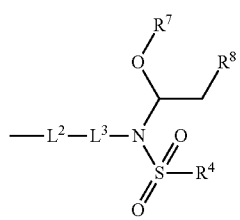

(6)

where $R^4$ represents a $C_1$-$C_8$ alkyl group in which a part or all of hydrogen atoms may be substituted with a fluorine atom or a chlorine atom; $L^2$ represents a single bond, an oxygen atom, —$CH_2$—O—, —C(=O)—, —C(=O)—O— or —O—C(=O)—; $R^7$ represents a $C_1$-$C_{15}$ straight, $C_3$-$C_{15}$ branched or $C_6$-$C_{15}$ cyclic hydrocarbon group in which a part or all of hydrogen atoms may be substituted with a fluorine atom or a chlorine atom; $R^8$ represents a hydrogen atom, or a $C_1$-$C_{15}$ straight, $C_3$-$C_{15}$ branched or $C_6$-$C_{15}$ cyclic hydrocarbon group in which a part or all of hydrogen atoms may be substituted with a fluorine atom or a chlorine atom; $R^7$ and $R^8$ may be bonded together to form a ring structure; and $L^3$ represents a single bond, or a $C_1$-$C_{15}$ straight or $C_3$-$C_{15}$ branched divalent hydrocarbon group in which a part of carbon atoms may be replaced by an oxygen atom and in which a part or all of hydrogen atoms may be substituted with a fluorine atom or a chlorine atom.

[Inventive Aspect 4]

The positive-type resist composition according to any one of Inventive Aspects 1 to 3, wherein the vinyl compound is a vinyl compound with at least two vinyl ether groups.

[Inventive Aspect 5]

The positive-type resist composition according to any one of Inventive Aspects 1 to 4, wherein the photoacid generator is a N-sulfonyloxyimide compound or oxime-O-sulfonate compound having a divalent group of the following general formula (7)

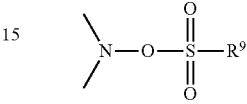

(7)

where $R^9$ represents a $C_1$-$C_{12}$ alkyl group in which a part or all of hydrogen atoms may be substituted with a fluorine atom, or either a phenyl group, a naphthyl group or a biphenyl group in which a part or all of hydrogen atoms on an aromatic ring may be substituted with a fluorine atom, a chlorine atom, a methyl group or a trifluoromethyl group; and two bonds of a nitrogen atom may be bonded to different atoms to form single bonds, respectively, or may be bonded to one atom to form a double bond.

[Inventive Aspect 6]

The positive-type resist composition according to any one of Inventive Aspects 1 to 5, wherein the photoacid generator is a compound of the following general formula (8)

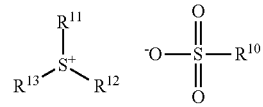

(8)

where $R^{10}$ represents a $C_1$-$C_{12}$ alkyl group in which a part or all of hydrogen atoms may be substituted with a fluorine atom, or either a phenyl group, a naphthyl group or a biphenyl group in which a part or all of hydrogen atoms on an aromatic ring may be substituted with a fluorine atom, a chlorine atom, a methyl group, a trifluoromethyl group, a methoxy group, a phenoxy group or a thiophenyl group; and $R^{11}$ to $R^{13}$ each independently represent either a phenyl group, a naphthyl group or a biphenyl group in which a part or all of hydrogen atoms on an aromatic ring may be substituted with a methyl group, a trifluoromethyl group, a methoxy group, a phenoxy group, a thiophenyl group, a fluorine atom or a chlorine atom.

[Inventive Aspect 7]

The positive-type resist composition according to any one of Inventive Aspects 1 to 6, wherein, assuming a mass of the fluorine-containing aliphatic alcohol as 100, the ratio of a mass of the polymer to the mass of the fluorine-containing alcohol is in a range of 0.5 to 30 and the ratio of a mass of the vinyl compound to the mass of the fluorine-containing aliphatic alcohol is in a range of 0.05 to 20; and wherein, assuming a total mass of the polymer and the vinyl compound as 100, the ratio of a mass of the photoacid generator to the total mass of the polymer and the vinyl compound is in a range of 0.01 to 15.

[Inventive Aspect 8]

The positive-type resist composition according to any one of Inventive Aspects 1 to 7, wherein the repeating unit A is contained in an amount of 25 to 80 mol % and the repeating unit B is contained in an amount of 20 to 75 mol % of the repeating unit B relative to the polymer.

In the present invention, the positive-type resist composition uses, as the solvent, the fluorine-containing aliphatic alcohol that does not cause erosion of organic materials. It is therefore possible to, when the positive-type resist composition is applied as a resist solution by a wet application process to form a resist film on an organic material such as an organic polymer substrate or an organic coated substrate, easily achieve fine patterning of the resist film with no adverse influence on the organic material, such as less dissolution or swelling of the organic material by the solvent.

When the resist film is formed with the application of the positive-type resist composition by a wet application process and thermally cured, there occurs linking reaction of the polymer and the vinyl compound in the resist film such that the resulting resist film or resist pattern can secure durability so as not to cause dissolution or swelling by a developer and by an organic solvent.

Because of the use of the photoacid generator, the resist film shows photosensitivity after the thermal curing and, when exposed to light in photolithography, generates an acid to cleave bonds between the polymer and the vinyl compound in the exposed portions of the resist film such that the exposed portions of the resist film are made soluble in the developer. The resist composition can thus secure sufficient developer solubility for use as a resist. As the unexposed portions of the resist film are made insoluble in or unswollen by the developer or organic solvent due to the thermal curing as mentioned above, the resist pattern can be maintained even with the application or immersion of the developer or organic solvent.

DESCRIPTION OF THE EMBODIMENTS

The positive-type resist composition of the present invention is characterized by using a specific fluorine-containing aliphatic alcohol that does not provide an adverse influence on organic materials, such as less dissolution or swelling of organic materials, and being prepared by dissolving a polymer, a vinyl compound and a photoacid generator in the fluorine-containing aliphatic alcohol.

Hereinafter, the positive-type resist composition of the present invention will be described below.

1. Fluorine-Containing Aliphatic Alcohol (Resist Solvent)

The positive-type resist composition of the present invention contains, as the resist solvent, a fluorine-containing monohydric $C_2$-$C_8$ aliphatic alcohol in which the number of hydrogen atoms is equal to or less than the number of fluorine atoms.

A fluorine-containing di- or higher-hydric aliphatic alcohol has a high boiling point. It is thus difficult to, when a resist composition containing such a high-boiling alcohol is applied to form a resist film, evaporate and remove the high-boiling alcohol by heating from the resist film and thereby impossible to obtain the resist film with a uniform thickness. It is difficult to a resist film with a uniform thickness by the application of a resist composition containing an alcohol of one carbon atom because the alcohol of one carbon atom has a low boiling point. It is also difficult to a resist film with a uniform thickness by the application of a resist composition containing an alcohol of 9 or more carbon atoms because the alcohol or 9 or more carbon atoms is low in fluidity or in solid form at room temperature (20° C.). Further, an alcohol in which the number of hydrogen atoms is more than the number of fluorine atoms has a strong property of dissolving therein an organic substance. It is thus likely that an organic film or organic polymer substrate below the resist film will be wetted with such an alcohol.

In view of the storage stability of the resist composition, it is preferable that a fluorine atom is not bonded to a carbon atom adjacent to a hydroxy group in the fluorine-containing aliphatic alcohol.

Preferably, the fluorine-containing aliphatic alcohol has a boiling point higher than the substrate temperature during the application of the resist composition. It is particularly preferable that the boiling point of the fluorine-containing aliphatic alcohol is 20° C. or more higher, more preferably 50° C. or more higher, than the substrate temperature during the application of the resist composition. If the boiling point of the fluorine-containing aliphatic alcohol is lower than the substrate temperature during the application of the resist composition, the resist film may not be formed with sufficient uniformity due to rapid evaporation of the fluorine-containing aliphatic alcohol during the application operation so that it is difficult to obtain a fine resist pattern by lithography. Further, the boiling point of the fluorine-containing aliphatic alcohol is preferably 200° C. or lower, more preferably 180° C. or lower. If the boiling point of the fluorine-containing aliphatic alcohol is higher 200° C., it is difficult to evaporate and remove the fluorine-containing aliphatic alcohol by heating from the resist film so that the resist film may not be obtained with a uniform thickness.

Preferred examples of the fluorine-containing aliphatic alcohol usable in the resist composition of the present invention are 2,2,2-trifluoroethanol, 2,2,3,3-tetrafluoropropanol, 2,2,3,3,3-pentafluoropropanol, 2,2,3,4,4,4-hexafluorobutanol, 2,2,3,3,4,4,4-heptafluorobutanol, 2,2,3,3,4,4,5,5-octafluoropentanol, 2,2,3,3,4,4,5,5,5-nonafluoropentanol, 3,3,4,4,5,5,6,6,6-nonafluorohexanol, 2,2,3,3,4,4,5,5,6,6,7,7-dodecafluoroheptanol, 2,2,3,3,4,4,5,5,6,6,7,7,7-tridecafluoroheptanol, 3,3,4,4,5,5,6,6,7,7,8,8,8-tridecafluorooctanol, (1,2,2,3,3,4,4,5-octafluorocyclopentyl) methanol, (1,2,2,3,3,4,4,5-octafluorocyclopentyl)ethanol and 2-(1,2,2,3,3,4,4,5-octafluorocyclopentyl)propane-2-ol. These solvents can be used in combination of two or more kinds thereof.

Among others, 2,2,2-trifluoroethanol, 2,2,3,3-tetrafluoropropanol, 2,2,3,4,4,4-hexafluorobutanol or 2,2,3,3,4,4,5,5-octafluoropentanol is particularly preferred as the fluorine-containing aliphatic alcohol in the positive-type resist composition of the present invention in view of the availability of the alcohol and the sufficient solubility of the other component of the resist composition, such as polymer or photoacid generator, in the alcohol.

2. Polymer 2.1. Repeating Unit A

In the positive-type resist composition of the present invention, the polymer has a repeating unit A of the above general formula (1) because the polymer is soluble in the fluorine-containing aliphatic alcohol in the presence of the repeating unit A.

As a side chain of the repeating unit A is low in polarity and is flexible, the polymer having such a repeating unit shows sufficient solubility in the fluorine-containing aliphatic alcohol. By contrast, a polymer whose repeating unit has a cyclic alkyl group at a side chain thereof does not show sufficient solubility in the fluorine-containing aliphatic alcohol. The reason for this is assumed that the cyclic alkyl group is poor in flexibility. A polymer whose repeating unit has a trialkylamino group at a side chain thereof does not also show sufficient solubility in the fluorine-containing aliphatic alcohol. The reason for this is assumed that the trialkylamino group is high in polarity.

In the repeating unit A, $R^1$ is preferably a hydrogen atom, fluorine atom, methyl group or trifluoromethyl group in view of the availability of the monomer.

Further, preferable examples of $R^2$ in the general formula (1) are $C_1$-$C_8$ straight or $C_3$-$C_8$ branched alkyl groups as indicated below.

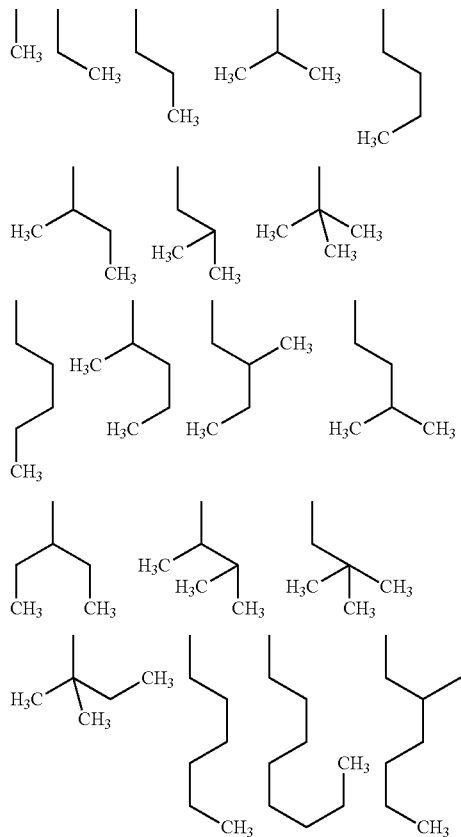

It is particularly preferable to use a $C_1$-$C_6$ alkyl group as $R^2$ in the polymer of the positive-type resist composition in view of the ease of synthesis of the monomer and the ease of dissolution of the resulting polymer in the fluorine-containing aliphatic alcohol. The following are particularly preferred examples of the $C_1$-$C_6$ alkyl group as $R^2$.

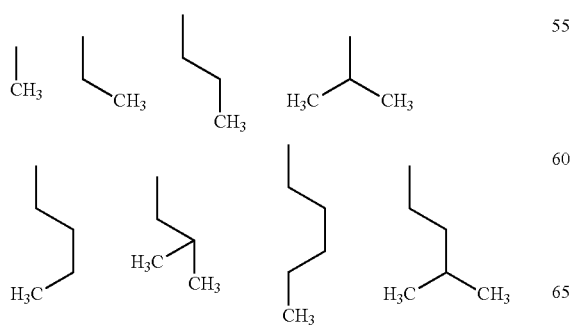

-continued

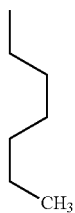

As $R^2$, there can alternatively be used a $C_1$-$C_8$ straight or $C_3$-$C_8$ branched alkyl group in which a part of carbon atoms is replaced by an oxygen atom as indicated below.

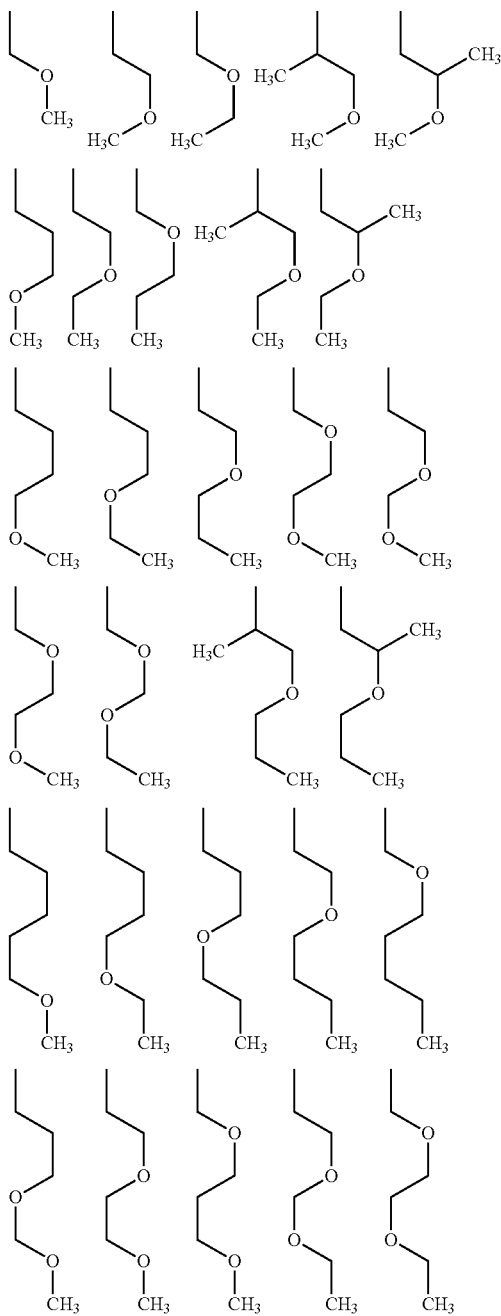

-continued

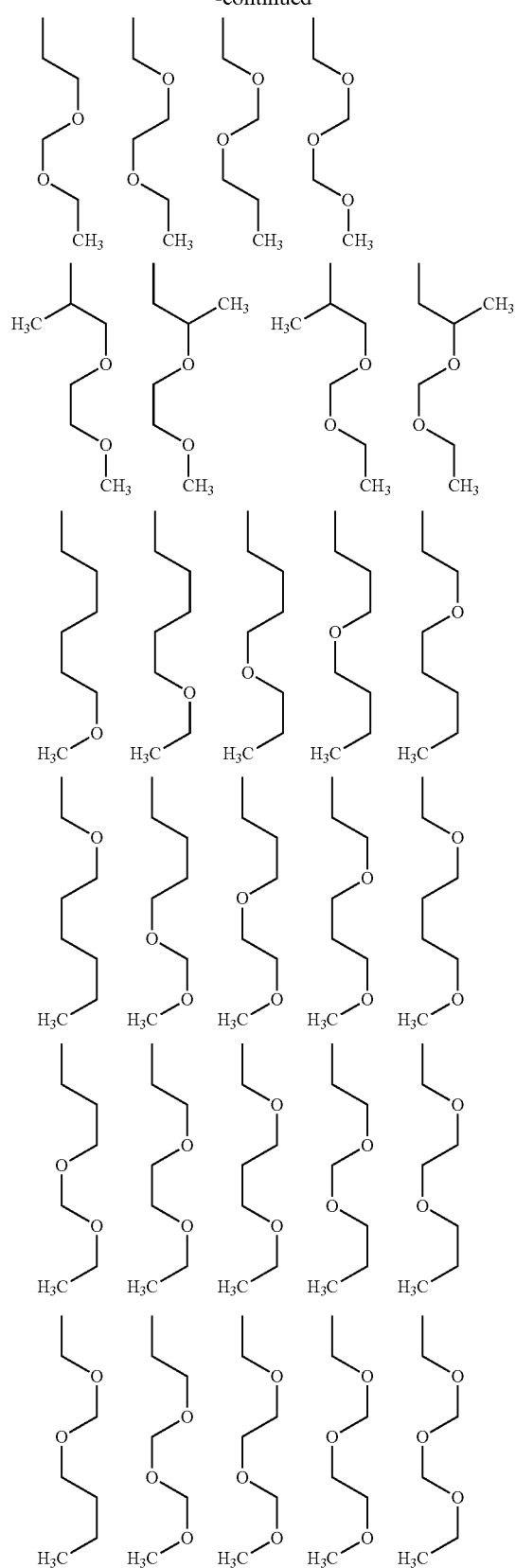

As such an alkyl group as R² in the polymer of the positive-type resist composition, preferred are those indicated below in view of the ease of synthesis of the monomer and the ease of dissolution of the resulting polymer in the fluorine-containing aliphatic alcohol.

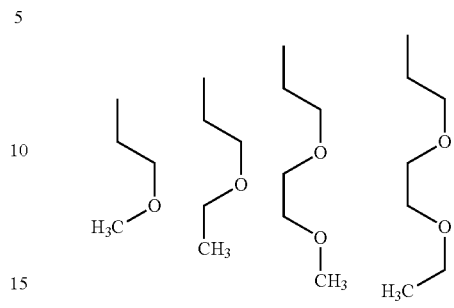

There can alternatively be used, as $R^2$, a $C_1$-$C_8$ straight or $C_3$-$C_8$ branched alkyl group in which a part of hydrogen atoms is substituted with a fluorine atom. As such an alkyl group, preferred are those indicated below in view of the ease of synthesis of the monomer and the ease of dissolution of the resulting polymer in the fluorine-containing alcohol.

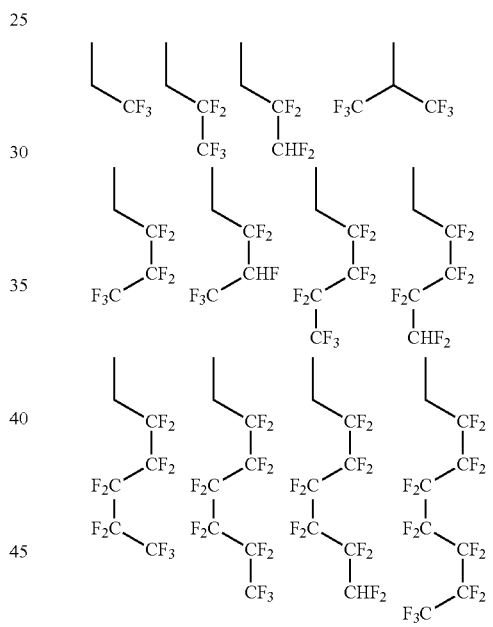

Further, there can alternatively be used, as $R^2$, a $C_1$-$C_8$ straight or $C_3$-$C_8$ branched alkyl group in which a part of carbon atoms is replaced by an oxygen atom and in which a part of hydrogen atoms is substituted with a fluorine atom. As such an alkyl group, preferred are those indicated below in view of the ease of synthesis of the monomer and the ease of dissolution of the resulting polymer in the fluorine-containing alcohol.

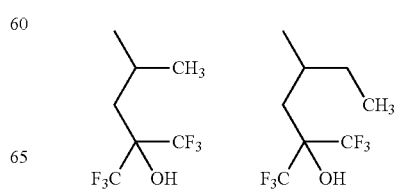

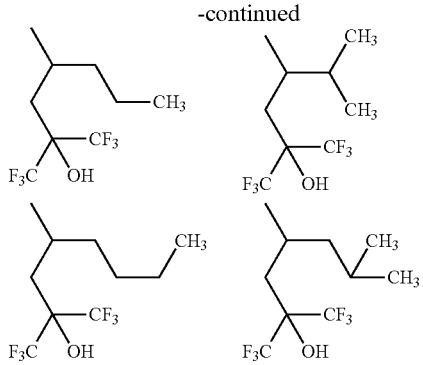

2.2. Repeating Unit B

In the positive-type resist composition of the present invention, the polymer needs to have a functional group that serves as a bonding site to form a chemical bond with the vinyl compound for the thermal curing of the resist film. More specifically, the polymer preferably has a carboxyl group or an alkylsulfoneamide group at a side chain thereof. This acidic group is capable of being reacted and bonded with the vinyl compound by heating, but is difficult to form a bond with the vinyl compound when stored in a cool dark place or refrigerator. Even when the acidic group is reacted and bonded with the vinyl compound, the reaction rate between the acidic group and the vinyl compound is low in the cool dark place or refrigerator. The polymer can thus obtain sufficient storage stability.

Thus, the polymer has a repeating unit B of the above general formula (2) in the resist composition of the present invention.

In the general formula (2), $R^3$ is preferably a hydrogen atom, fluorine atom, methyl group or trifluoromethyl group in view of the ease of synthesis of the monomer.

The following repeating unit B1 having a carboxyl or alkylsulfoneamide group and the following repeating unit B1 having a carboxyl or alkylsulfoneamide group protected with a protecting group are specific examples of the repeating unit B

2.2.1. Repeating Unit B1 with Carboxyl or Alkylsulfoneamide Group

[Repeating Unit B1 with Carboxyl Group]

The repeating unit B1 with the carboxyl group is represented by the following general formula (9).

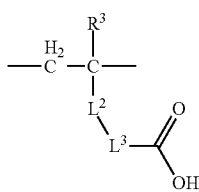

(9)

In the general formula (9), $R^3$ represents a hydrogen atom, a fluorine atom, or a $C_1$-$C_3$ alkyl group in which a part or all of hydrogen atoms may be substituted with a fluorine atom or a chlorine atom; $L^2$ represents a single bond, an oxygen atom, —$CH_2$—O—, —C(=O)—, —C(=O)—O— or —O—C(=O)—; and $L^3$ represents a single bond, or a divalent $C_1$-$C_{15}$ straight or $C_3$-$C_{15}$ branched hydrocarbon group in which a part of carbon atoms may be replaced by an oxygen atom and in which a part or all of hydrogen atoms may be substituted with a fluorine atom or a chlorine atom.

Among others, $R^3$ is preferably a hydrogen atom, fluorine atom, methyl group or trifluoromethyl group in view of the ease of synthesis of the monomer.

As the repeating unit B1 with the carboxyl group, preferred are those indicated below in view of the ease of synthesis of the monomer and the ease of dissolution of the resulting polymer in the fluorine-containing aliphatic alcohol.

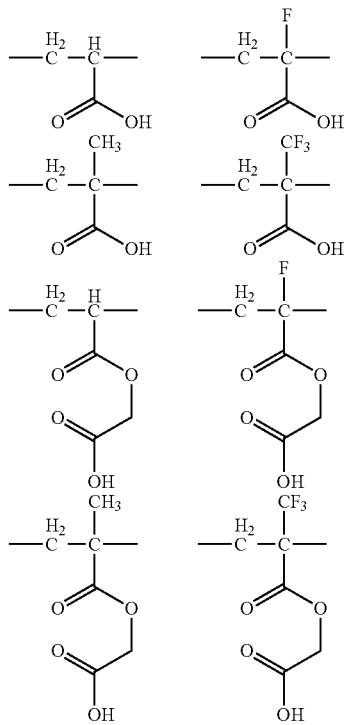

[Repeating Unit B1 with Alkylsulfoneamide Group]

The repeating unit B with the alkylsulfoneamide group is represented by the following general formula (10).

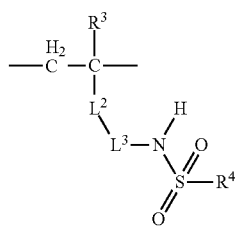

(10)

In the general formula (10), $R^3$ represents a hydrogen atom, a fluorine atom, or a $C_1$-$C_3$ alkyl group in which a part or all of hydrogen atoms may be substituted with a fluorine atom or a chlorine atom; $R^4$ represents an $C_1$-$C_8$ alkyl group in which a part or all of hydrogen atoms may be substituted with a fluorine atom or a chlorine atom; $L^2$ represents a single bond, an oxygen atom, —$CH_2$—O—, —C(=O)—, —C(=O)—O— or —O—C(=O)—; and $L^3$ represents a single bond, or a divalent $C_1$-$C_{15}$ straight or $C_3$-$C_{15}$ branched hydrocarbon group in which a part of carbon atoms may be replaced by an oxygen atom and in which a part or all of hydrogen atoms may be substituted with a fluorine atom or a chlorine atom.

Among others, $R^3$ is preferably a hydrogen atom, fluorine atom, methyl group or trifluoromethyl group in view of the ease of synthesis of the monomer. Further, $R^4$ is preferably a perfluoroalkyl group in view of the high reactivity of the resulting polymer with the vinyl compound.

As the repeating unit B1 with the perfluoroalkylsulfoneamide group, preferred are those indicated below in view of the ease of synthesis of the monomer and the ease of dissolution of the resulting polymer in the fluorine-containing aliphatic alcohol.

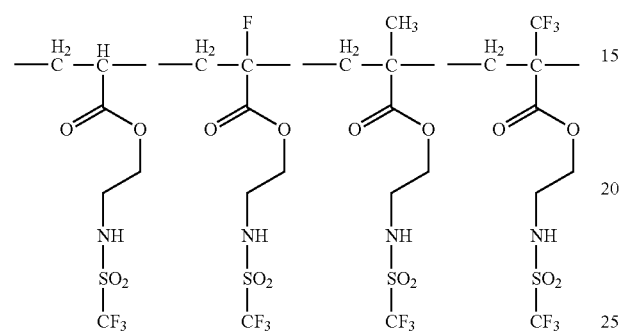

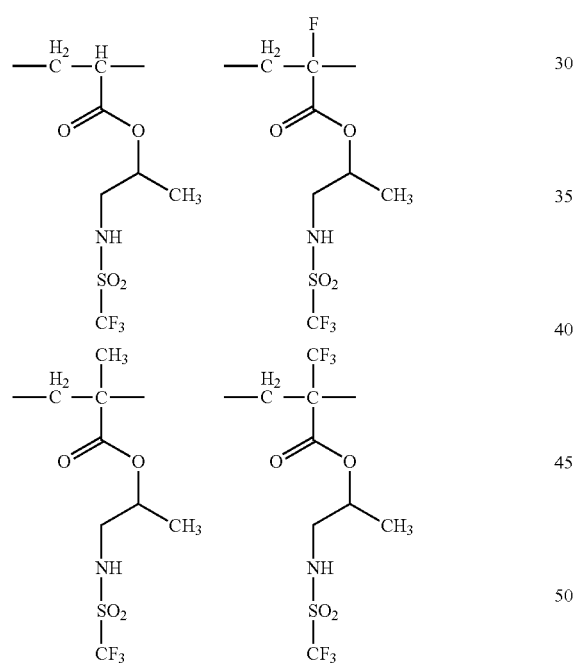

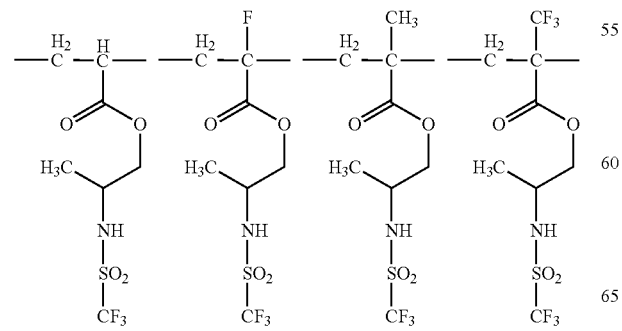

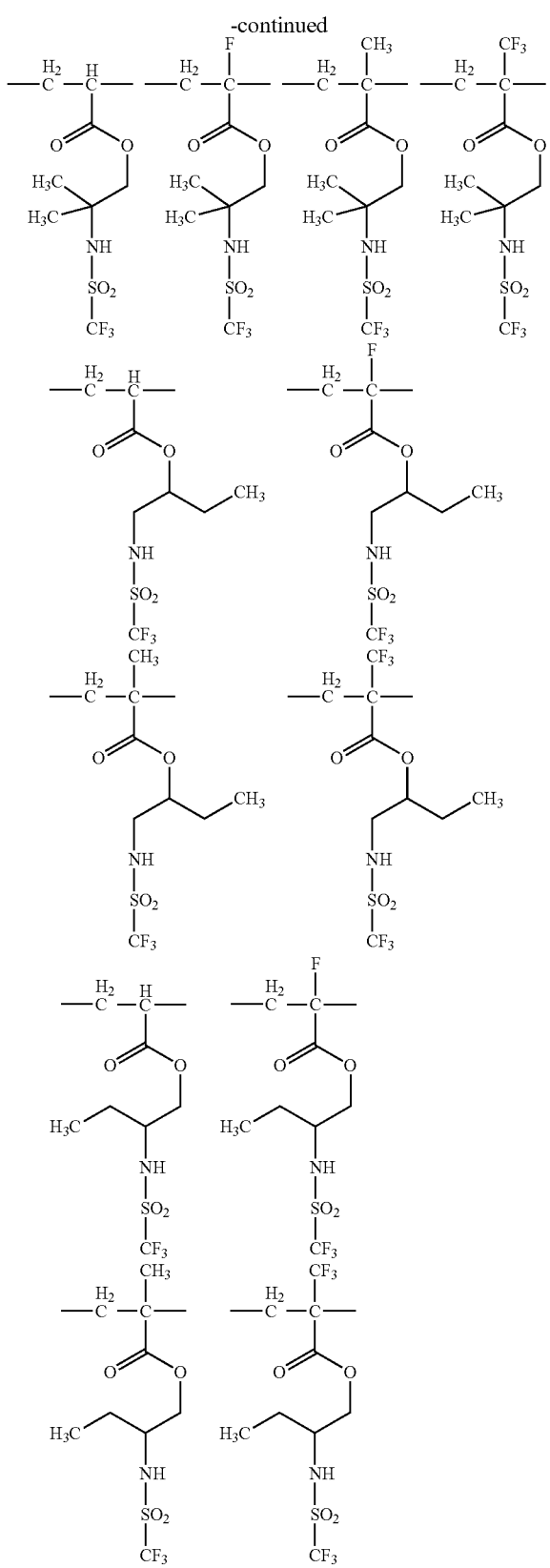

2.2.2 Repeating Unit B2 with Protected Carboxyl or Alkylsulfoneamide Group

In the positive-type resist composition of the present invention, it is feasible in the polymer unit to contain the above-mentioned repeating unit B2 as the repeating unit having the functional group that serves as the bonding site for the chemical bonding with the vinyl compound. As in the case of the repeating unit B1, the repeating unit B2 is capable of being reacted and bonded with the vinyl group by heating because the repeating unit B2 has an acetal structure formed with a protected carboxyl or alkylsulfonic group so as to generate a carboxyl or alkylsulfoneamide group by heating. Before the heating, however, the repeating unit B2 does not have any group that can be bonded with the vinyl compound. The polymer can thus obtain sufficient storage stability without forming a bond between the repeating unit B2 and the vinyl compound when stored in a cool dark place or refrigerator.

In the resist composition of the present invention, both of the repeating unit B1 and the repeating unit B2 may be contained in the polymer. Further, the polymer having the repeating unit B1 and the polymer having the repeating unit B2 may be used in combination in the resist composition.

There is no particular limitation on the synthesis method of the polymer having the repeating unit B2. It is feasible to synthesize the polymer having the repeating unit B2 by a known method. For example, the polymer having the repeating unit B2 can be synthesized by reacting a monomer compound having a carboxyl or alkylsulfoneamide group at a side chain thereof with a vinyl ether so as to form a monomer with an acetal structure, and then, polymerizing the monomer (hereinafter referred to as "monomer acetalization method"), or by preparing the polymer having the repeating unit B1, and then, reacting the polymer with a vinyl ether so as to form an acetal structure in the polymer (hereinafter referred to as "polymer acetalization method"). In each of the monomer acetalization method and the polymer acetalization method, it is feasible to perform the reaction between the carboxyl- or alkylsulfoneamide-containing monomer or polymer and the vinyl ether by mixing the monomer or polymer with the vinyl ether. For improvement in final reaction rate, the reaction may be promoted by heating the mixture or adding an acid catalyst to the mixture. Specific examples of the acid catalyst are methanesulfonic acid, camphorsulfonic acid, paratoluenesulfonic acid and trifluoromethanesulfonic acid. Further, the reaction between the carboxyl or alkylsulfoneamide group and the vinyl group may be performed with the use of a solvent in order to remove the heat of the reaction and decrease the viscosity of the reaction solution. The solvent is preferably of the type that does not interfere with the reaction between the carboxyl or alkylsulfoneamide group and the vinyl ether. Specific examples of the solvent are: ketones such as acetone, 2-butanone and 4-methyl-2-pentanone; esters such as ethyl acetate, propyl acetate, n-butyl acetate, isobutyl acetate and propylene glycol monomethyl ether acetate; aromatic compounds such as toluene and xylene; and ethers such as ethyl ether, isopropyl ether, n-butyl ether and ethylene glycol diethyl ether. These solvents can be used solely or in the form of a mixture thereof.

As the vinyl ether for the formation of the acetal structure, there can be used a known vinyl ether compound. Preferred examples of the vinyl ether compound are methyl vinyl ether, ethyl vinyl ether, n-propyl vinyl ether, isopropyl vinyl ether, n-butyl vinyl ether, isobutyl vinyl ether, tert-butyl vinyl ether, cyclohexyl vinyl ether, cylcohexylmethyl vinyl ether, 2-hydroxyethyl vinyl ether, 3-hydroxypropyl vinyl ether, 4-hydroxybutyl vinyl ether, 4-hydroxycyclohexyl vinyl ether, 4-(hydroxymethyl)cyclohexyl vinyl ether, 2,3-dihydrofuran, 3,4-dihydro-2H-pyrane, 2,2,2-trifloroethyl vinyl ether, 2,2,3,3-tetrafluoropropyl vinyl ether, 2,2,3,3,3-pentafluoropropyl vinyl ether, 2,2,3,4,4,4-hexafluorobutyl vinyl ether, 2,2,3,3, 4,4,4-heptafluorobutyl vinyl ether, 2,2,3,3,4,4,5,5-octafluoropentyl vinyl ether and 2,2,3,3,4,4,5,5,5-nonafluoropentyl vinyl ether.

In the general formula (2), $R^3$ is preferably a hydrogen atom, fluorine atom, methyl group or trifluoromethyl group in view of the ease of synthesis of the monomer.

The following are specific examples of the protected carboxyl-containing repeating unit B2 capable of generating the carboxyl group and the protected alkylsulfoneamide-containing repeating unit B2 capable of generating the alkylsulfoneamide group.

[Carboxyl-Generating Repeating Unit B2]

The carboxyl-generating repeating unit B2 is represented by the following general formula (11).

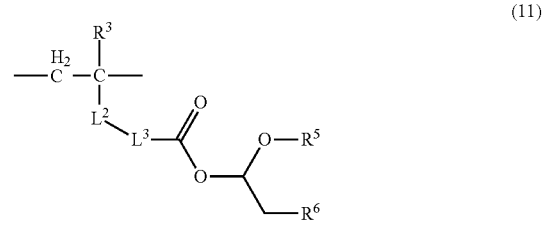

(11)

In the general formula (11), $R^3$ represents a hydrogen atom, a fluorine atom, or a $C_1$-$C_3$ alkyl group in which a part or all of hydrogen atoms may be substituted with a fluorine atom or a chlorine atom; $R^5$ represents a $C_1$-$C_{15}$ straight, branched or cyclic hydrocarbon group in which a part or all of hydrogen atoms may be substituted with a fluorine atom or a chlorine atom; $R^6$ represents a hydrogen atom, or a $C_1$-$C_{15}$ straight, branched or cyclic hydrocarbon group in which a part or all of hydrogen atoms may be substituted with a fluorine atom or a chlorine atom; $R^5$ and $R^6$ may be chemically bonded together to form a ring structure; $L^2$ represents a single bond, an oxygen atom, —$CH_2$—O—, —C(=O)—, —C(=O)—O— or —O—C(=O)—; and $L^3$ represents a single bond, or a divalent $C_1$-$C_{15}$ straight or $C_3$-$C_{15}$ branched hydrocarbon group in which a part of carbon atoms may be replaced by an oxygen atom and in which a part or all of hydrogen atoms may be substituted with a fluorine atom or a chlorine atom.

Namely, the protecting group for the carboxyl group is the following.

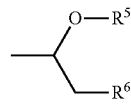

In the above formula, $R^5$ represents a $C_1$-$C_{15}$ straight, $C_3$-$C_{15}$ branched or $C_6$-$C_{15}$ cyclic hydrocarbon group in which a part or all of hydrogen atoms may be substituted with a fluorine atom or a chlorine atom; $R^6$ represents a hydrogen atom, or a $C_1$-$C_{15}$ straight, $C_3$-$C_{15}$ branched or $C_6$-$C_{15}$ cyclic hydrocarbon group in which a part or all of hydrogen atoms may be substituted with a fluorine atom or a chlorine atom; and $R^5$ and $R^6$ may be bonded together to form a ring structure.

In view of the ease of synthesis of the monomer, $R^3$ is preferably a hydrogen group, fluorine atom, methyl group or trifluoromethyl group.

As the carboxyl-generating repeating unit B2, preferred are those indicated below in view of the ease of synthesis of the monomer and the ease of dissolution of the resulting polymer in the fluorine-containing aliphatic alcohol.

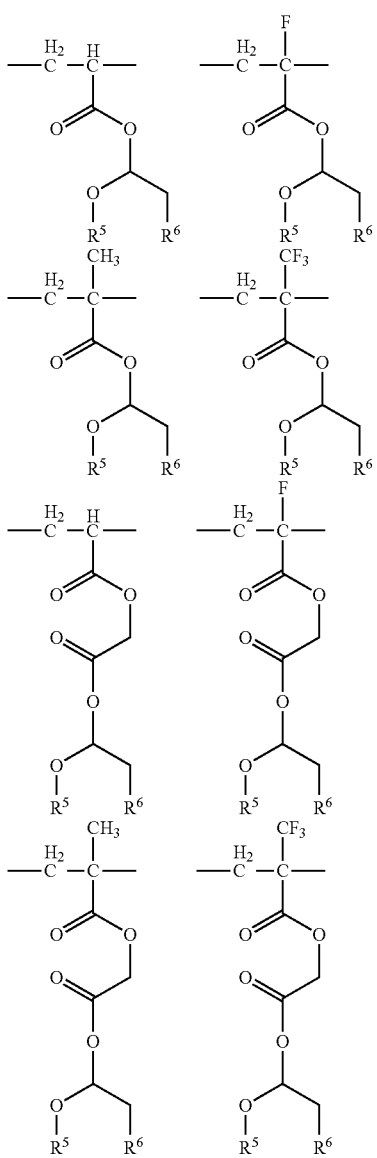

In the above formulas, $R^5$ represents a $C_1$-$C_{15}$ straight, $C_3$-$C_{15}$ branched or $C_6$-$C_{15}$ cyclic hydrocarbon group in which a part or all of hydrogen atoms may be substituted with a fluorine atom or a chlorine atom; $R^6$ represents a hydrogen atom, or a $C_1$-$C_{15}$ straight, $C_3$-$C_{15}$ branched or $C_6$-$C_{15}$ cyclic hydrocarbon group in which a part or all of hydrogen atoms may be substituted with a fluorine atom or a chlorine atom; and $R^5$ and $R^6$ may be bonded together to form a ring structure.

In view of the ease of synthesis of the monomer and the availability of the vinyl ether as the raw material, $R^5$ is preferably a methyl group, ethyl group, n-propyl group, isopropyl group, n-butyl group, isobutyl group, tert-butyl group, cyclohexyl group, cyclohexylmethyl group, 2-hydroxyethyl group, 3-hydroxypropyl group, 4-hydroxybutyl group, 4-hydroxycyclohexyl group or 4-(hydroxymethyl)cyclohexyl group; and $R^6$ is preferably a hydrogen atom or methyl group. $R^5$ and $R^6$ may be bonded together to form a ring structure. Further, $R^3$ is preferably a hydrogen atom, fluorine atom, methyl group or trifluoromethyl group in view of the ease of synthesis of the monomer.

Preferred examples of the carboxyl-generating repeating unit B2 are those indicated below.

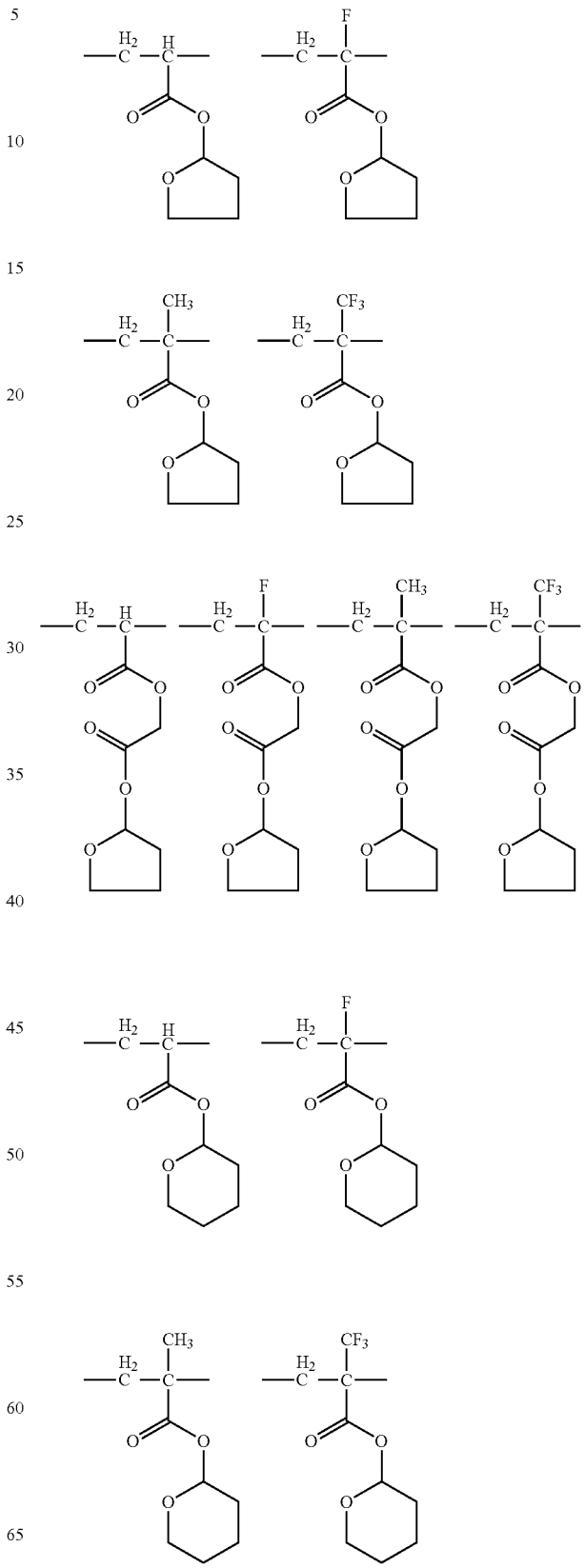

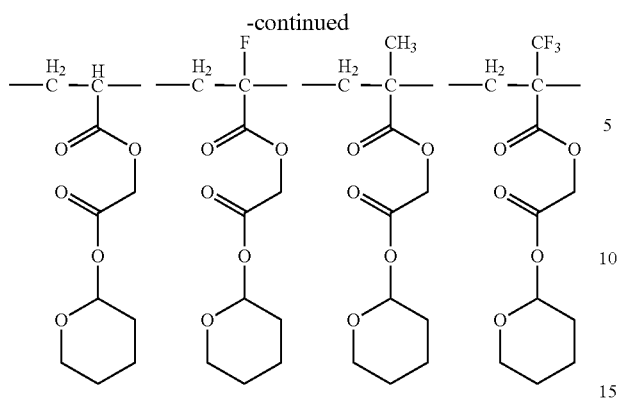

[Alkylsulfoneamide-Generating Repeating Unit B2]

The alkylsulfoneamide-generating repeating unit B2 is represented by the following general formula (12).

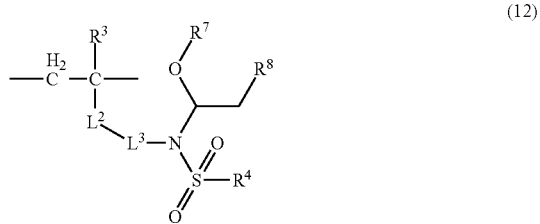

(12)

In the general formula (12), $R^3$ represents a hydrogen atom, a fluorine atom, or a $C_1$-$C_3$ alkyl group in which a part or all of hydrogen atoms may be substituted with a fluorine atom or a chlorine atom; $R^4$ represents a $C_1$-$C_8$ alkyl group in which a part or all of hydrogen atoms may be substituted with a fluorine atom or a chlorine atom; $R^7$ represents a $C_1$-$C_{15}$ straight, $C_3$-$C_{15}$ branched or $C_6$-$C_{15}$ cyclic hydrocarbon group in which a part or all of hydrogen atoms may be substituted with a fluorine atom or a chlorine atom; $R^8$ represents a hydrogen atom, or a $C_1$-$C_{15}$ straight, $C_3$-$C_{15}$ branched or $C_6$-$C_{15}$ cyclic hydrocarbon group in which a part or all of hydrogen atoms may be substituted with a fluorine atom or a chlorine atom; $R^7$ and $R^8$ may be bonded together to form a ring structure; $L^2$ represents a single bond, an oxygen atom, —$CH_2$—O—, —C(=O)—, —C(=O)—O— or —O—C(=O)—; and $L^3$ represents a single bond, or a divalent $C_1$-$C_{15}$ straight or $C_3$-$C_{15}$ branched hydrocarbon group in which a part of carbon atoms may be replaced by an oxygen atom and in which a part or all of hydrogen atoms may be substituted with a fluorine atom or a chlorine atom.

In view of the ease of synthesis of the monomer, $R^3$ is preferably a hydrogen group, fluorine atom, methyl group or trifluoromethyl group.

Namely, the protecting group for the alkylsulfoneamide group is the following.

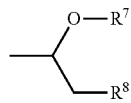

In the above formula, $R^7$ represents a $C_1$-$C_{15}$ straight, $C_3$-$C_{15}$ branched or $C_6$-$C_{15}$ cyclic hydrocarbon group in which a part or all of hydrogen atoms may be substituted with a fluorine atom or a chlorine atom; $R^8$ represents a hydrogen atom, or a $C_1$-$C_{15}$ straight, $C_3$-$C_{15}$ branched or $C_6$-$C_{15}$ cyclic hydrocarbon group in which a part or all of hydrogen atoms may be substituted with a fluorine atom or a chlorine atom; and $R^7$ and $R^8$ may be bonded together to form a ring structure.

The alkylsulfoneamide-generating repeating unit B2 is preferably of the following general formula (13).

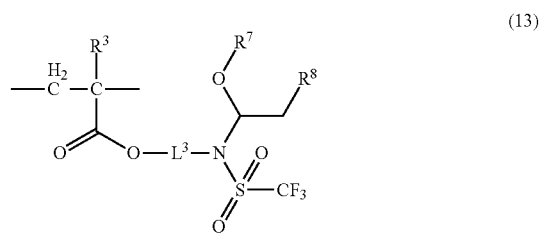

(13)

In the general formula (13), $R^3$ represents a hydrogen atom, a fluorine atom or a $C_1$-$C_3$ alkyl group in which a part or all of hydrogen atoms may be substituted with a fluorine atom or a chlorine atom; $R^4$ represents a $C_1$-$C_8$ alkyl group in which a part or all of hydrogen atoms may be substituted with a fluorine atom or a chlorine atom; $R^7$ represents a $C_1$-$C_{15}$ straight, $C_3$-$C_{15}$ branched or $C_6$-$C_{15}$ cyclic hydrocarbon group in which a part or all of hydrogen atoms may be substituted with a fluorine atom or a chlorine atom; $R^8$ represents a hydrogen atom or a $C_1$-$C_{15}$ straight, $C_3$-$C_{15}$ branched or $C_6$-$C_{15}$ cyclic hydrocarbon group in which a part or all of hydrogen atoms may be substituted with a fluorine atom or a chlorine atom; $R^7$ and $R^8$ may be bonded together to form a ring structure; and $L^3$ represents a divalent $C_2$-$C_4$ hydrocarbon group.

In the general formula (13), $R^7$ is preferably a methyl group, ethyl group, n-propyl group; isopropyl group, n-butyl group; isobutyl group; tert-butyl group; cyclohexyl group, cyclohexylmethyl group, 2-hydroxyethyl group, 3-hydroxylpropyl group, 4-hydroxybutyl group, 4-hydroxycyclohexyl group or 4-(hydroxymethyl)cyclohexyl group; and $R^8$ is preferably a hydrogen atom or methyl group in view of the ease of synthesis of the monomer and the availability of the vinyl ether as the raw material.

As mentioned above, $R^7$ and $R^8$ may be chemically bonded together to form a ring structure in the general formula (13). As the repeating unit B2 in which $R^7$ and $R^8$ are chemically bonded together, preferred are those of the following general formulas (14) and (15).

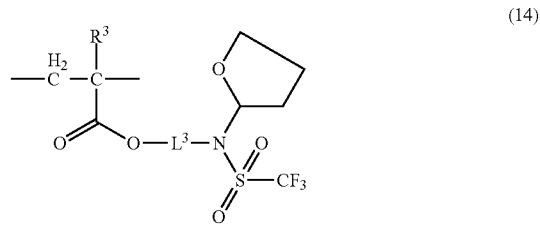

(14)

In the general formula (14), $R^3$ is a hydrogen group, fluorine atom or trifluoromethyl group; and $L^3$ is a divalent $C_2$-$C_4$ hydrocarbon group.

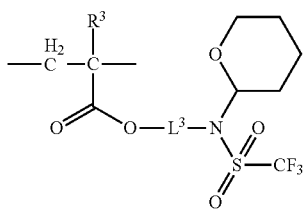

(15)

In the general formula (15), $R^3$ is a hydrogen group, fluorine atom or trifluoromethyl group; and $L^3$ is a divalent $C_2$-$C_4$ hydrocarbon group.

2.4. Content Ratio of Repeating Unit A, Repeating Unit B1 and Repeating Unit B2

In the positive-type resist composition of the present invention, the amount of the repeating unit A of the general formula (1) contained in the polymer is 25 to 80%, preferably 50 to 75%, relative to the total amount of the polymer in terms of mol %. If the amount of the repeating unit A is less than 25% or less, there is a possibility that: the polymer may be insoluble in the fluorine-containing aliphatic alcohol solvent; or the resist composition may not be applied with a uniform thickness onto the substrate. If the amount of the repeating unit A exceeds 80%, there is a possibility that the resist film may be insufficient in developer solubility so as to cause poor contrast (poor resolution) of the resist pattern.

The sum of the amount of the repeating unit B1 of the general formula (2) and the amount of the repeating unit B2 of the general formula (5) contained in the polymer is 20 to 75%, preferably 25 to 50%, relative to the total amount of the polymer in terms of mol %. There is a possibility that the resist film may become insufficient in developer solubility due to less bonding sites of the polymer to the vinyl compound, so as to cause poor contrast of the resist pattern or separation of the resist pattern from the substrate, if the sum of the amounts of the repeating units B1 and B2 is less than 20%. There is a possibility that, due to the existence of unreacted bonding sites on the polymer, the resist film may be too high in developer solubility so as to cause poor contrast of the resist pattern; the polymer may be insoluble in the fluorine-containing aliphatic alcohol solvent; or the resist composition may not be applied with a uniform thickness onto the substrate if the sum of the amounts of the repeating units B1 and B2 exceeds 75%. Although there is no particular limitation on the content ratio between the repeating units B1 and B2, the storage stability of the positive-resist resist composition can be improved with increase in the content of the repeating unit B2. In the case of containing the repeating unit B2 in the polymer for the purpose of improving the storage stability of the resist composition, it is preferable that the amount of the repeating unit B2 is larger than or equal to the amount of the repeating unit B1 relative to the total amount of the polymer in terms of mol %. If the amount of the repeating unit B2 is smaller than the amount of the repeating unit B1, the storage stability improvement effect may not be obtained sufficiently by the use of the repeating unit B2.

In the positive-type resist composition of the present invention, the polymer may contain any repeating unit other than the repeating unit A, the repeating unit B1 and the repeating unit B2 in order to impart the other function to the resist film.

2.5. Molecular Weight of Polymer

The polymer preferably has a weight-average molecular weight Mw of 1,000 to 500,000, more preferably 2,000 to 200,000, still more preferably 3,000 to 100,000, on the basis of polystyrene standards in the positive-type resist composition of the present invention.

The amount of the polymer contained in the positive-type resist composition is generally 0.5 to 30 parts by mass, preferably 1 to 15 parts by mass, more preferably 3 to 15 parts by mass, relative to 100 parts by mass of the fluorine-containing aliphatic alcohol used as the solvent. If the amount of the polymer is less than 0.5 parts by mass, it is difficult to form the resist film with a desired thickness with the application of the positive-type resist composition by a wet application process. If the amount of the polymer exceeds 30 parts by mass, the resist composition becomes high in viscosity so that it is difficult to form the resist film with a uniform thickness.

3. Vinyl Compound

The positive-type resist composition of the present invention contains, as the vinyl compound, a polyfunctional vinyl group, more specifically, a vinyl compound with two or more vinyl ether groups. The resist film, when formed from the positive-type resist composition, can secure solubility resistance by the bonding of the vinyl compound to the bonding sites of the polymer.

In view of the developer resistance and solvent resistance of the resist film, the vinyl compound preferably has three or more vinyl ether functional groups. A monofunctional vinyl compound or another polyfunctional vinyl compound may be used in combination in order to adjust the number of bonds between the polymer and the vinyl compound.

Preferably, the vinyl compound has a boiling point higher than or equal to the thermal curing temperature of the resist film. It is particularly preferable that the boiling point of the vinyl compound is 30° C. or more higher than the thermal curing temperature. If the boiling point of the vinyl compound is lower than the thermal curing temperature, a part or all of the vinyl compound becomes volatilized during the curing so that the resist film may not be cured sufficiently.

As the polyfunctional vinyl compound, there can suitably be used a compound of the general formula (16).

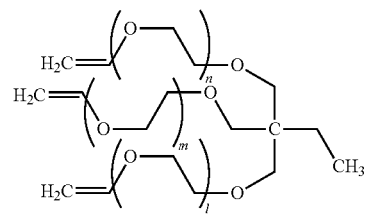

(16)

In the general formula (16), l, m and n each represent an integer of 0 to 25.

Specific examples of the compound of the general formula (16) are those indicated below.

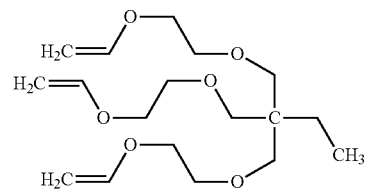

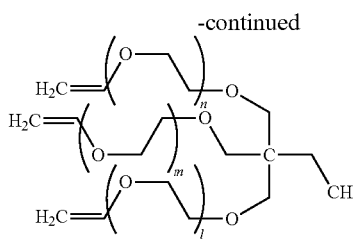

In the above formulas, l, m and n each represent an integer of 0 to 18. It is preferable that the average of the sum value l+m+n is in a range of 3 to 6.

These compounds are commercially available under the trade names of e.g. "TMPEOTVE", "TMPEOTVE-30" and "TMPEOTVE-60" from Nippon Carbide Industries Co., Inc.

The amount of the vinyl compound contained in the positive-type resist composition is generally 0.05 to 20 parts by mass, preferably 0.1 to 10 parts by mass, more preferably 0.3 to 10 parts by mass, relative to 100 parts by mass of the fluorine-containing aliphatic alcohol used as the solvent. If the amount of the vinyl compound is less than 0.05 parts by mass, the resist film may not be cured sufficiently by the bonding of the polymer and the vinyl compound so that it becomes difficult to impart sufficient solvent resistance to the resist film or becomes likely that dissolution or separation of the resist film will occur during the development. Thus, the amount of the vinyl compound is preferably 0.1 parts by mass or more, more preferably 0.3 parts by mass or more. On the other hand, some of the vinyl compound may remain unreacted and become eluted during the development so as to exert an adverse influence on the pattern formation if the amount of the vinyl compound exceeds 20 parts by mass. Thus, the amount of the vinyl compound is preferably 10 parts by mass or less.

4. Photoacid Generator

The positive-type resist composition of the present invention contains, as the photoacid generator, a compound capable of generating an acid by exposure so as to obtain the resist pattern after the development. The photoacid generator is preferably of the type that can impart sufficient developer solubility to exposed portions of the resist film after the exposure and provide the resist pattern with sufficient contrast after the development.

In the positive-type resist composition of the present invention, it is preferable that the photoacid generator is soluble in the fluorine-containing aliphatic alcohol solvent. The amount of the photoacid generator contained in the positive-type resist composition is generally 0.01 to 15 parts by mass, preferably 0.1 to 10 parts by mass, more preferably 0.5 to 10 parts by mass, relative to 100 parts by mass of the sum of the polymer and the vinyl compound. If the amount of the photoacid generator is less than 0.01 parts by mass, it is difficult to provide the resist pattern with sufficient contrast after the development. The amount of the photoacid generator is thus preferably 0.1 parts by mass or more, more preferably 0.5 parts by mass or more. If the amount of the photoacid generator exceeds 15 parts by mass, it is difficult to perform fine patterning of the resist film due to too high resist sensitivity. The amount of the photoacid generator is thus preferably 10 parts by mass or less.

Further, the photoacid generator preferably has a thermal decomposition temperature higher than the thermal curing temperature. More specifically, it is preferable that the decomposition initiation temperature of the photoacid generator is higher than the thermal curing temperature, more preferably 10° C. or more higher than the thermal curing temperature, still more preferably 20° C. or more higher than the thermal curing temperature. If the decomposition initiation temperature of the photoacid generator is low, the acid is also generated in the unexposed portions of the resist film so as to cause poor dissolution contrast of the resist pattern. The above temperature condition is not however an essential condition in view of the fact that the generation of a small amount of acid can be regulated with the use of an additive or additives.

As a component of the photoacid generator in the positive-type resist composition, there can be used any compound that is capable of generating an acid by exposure to high-energy irradiation and is soluble in the fluorine-containing aliphatic alcohol solvent. Examples of such a photoacid generator compound are a sulfonium salt, a iodonium salt, a sulfonyl-diazomethane, a N-sulfonyloxyimide and an oxime-O-sulfonate. These compounds can be used solely or in combination of two or more kinds thereof.

In view of the solubility of the photoacid generator in the fluorine-containing aliphatic alcohol solvent, a N-sulfonyloxyimide compound or oxime-O-sulfonate compound having a structure of the following general formula (7) is preferred as the photoacid generator in the positive-type resist composition of the present invention.

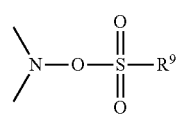

(7)

In the general formula (7), $R^9$ represents a $C_1$-$C_{12}$ alkyl group in which a part or all of hydrogen atoms may be substituted with a fluorine atom, or either a phenyl group, a naphthyl group or a biphenyl group in which a part or all of hydrogen atoms on an aromatic ring may be substituted with a fluorine atom, a chlorine atom, a methyl group or a trifluoromethyl group; and two bonds of a nitrogen atom may be bonded to different atoms to form single bonds, respectively, or may be bonded to one atom to form a double bond.

The following N-sulfonyloxyimide compounds are specific examples of the photoacid generator having the structure of the general formula (7) in which two bonds of a nitrogen atom are bonded to different atoms to form single bonds, respectively.

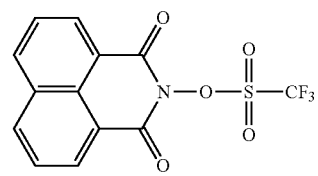

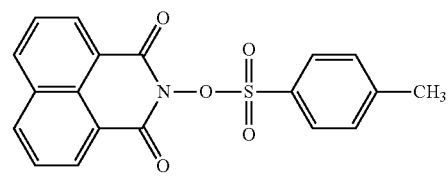

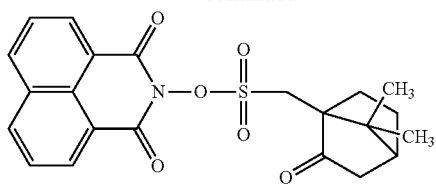

These compounds are commercially available under the trade names of e.g. "NAI-105", "NAI-101" and "NAI-106" from Midori Kagaku Co., Ltd.

The following oxime-O-sulfonate compounds are specific examples of the photoacid generator having the structure of the general formula (7) in which two bonds of a nitrogen atom are bonded to one atom to form a double bond.

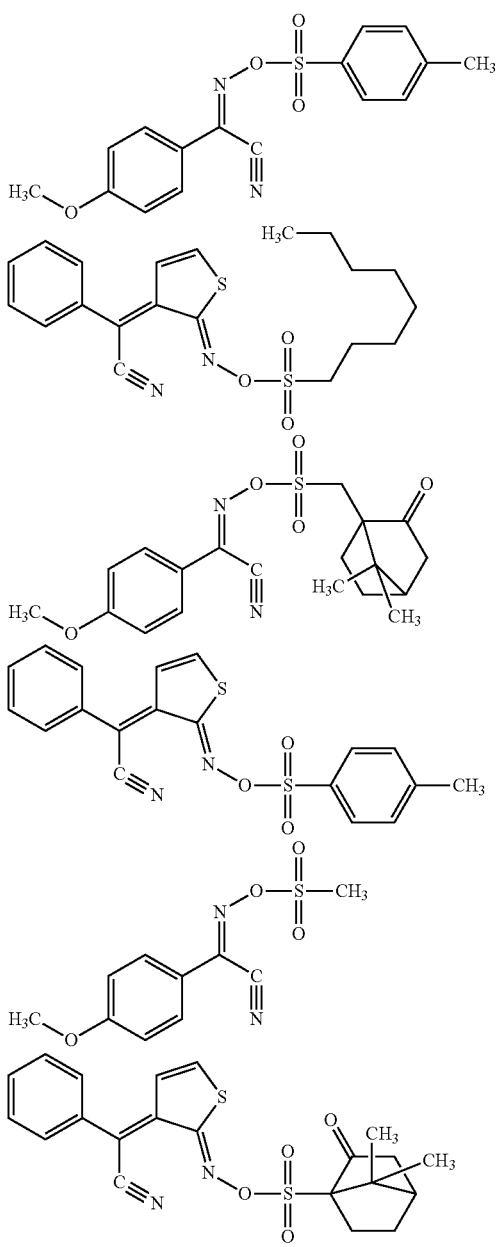

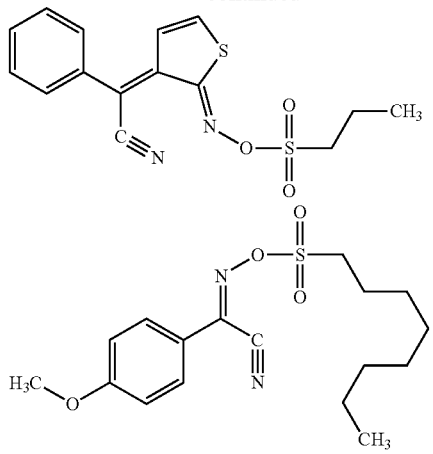

These compounds are commercially available under the trade names of e.g. "PAI-101", "PAI-106" and "PAI-1001" from Midori Kagaku Co., Ltd. and "IRGACURE PAG103", "IRGACURE PAG108", "IRGACURE PAG121", "CGI1380" and "CGI725" from BASF Japan Ltd.

The above photoacid generator has sensitivity in a wavelength range of ultraviolet rays such as g-ray (wavelength: 436 nm), h-ray (wavelength: 405 nm) and i-ray (wavelength: 365 nm) and thus generates an acid by irradiation with an ultraviolet ray from a high-pressure mercury lamp, a semiconductor laser or the like so as to change the irradiated portions of the resist film to be soluble in the developer. By the use of this photoacid generator in the positive-type resist composition, the irradiated portions of the resist film are made soluble in the developer under the action of the acid generated by exposure to ultraviolet irradiation for the formation of the resist pattern.

A sulfonium salt compound of the following general formula (8) is also preferred as the photoacid generator in the positive-type resist composition of the present invention in view of the solubility of the photoacid generator in the fluorine-containing aliphatic alcohol solvent.

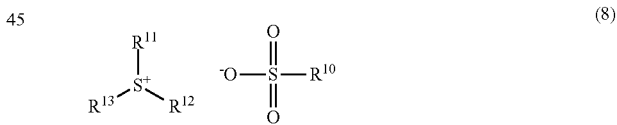

(8)

In the general formula (8), $R^{10}$ represents a $C_1$-$C_{12}$ alkyl group in which a part or all of hydrogen atoms may be substituted with a fluorine atom, or either a phenyl group, a naphthyl group or a biphenyl group in which a part or all of hydrogen atoms on an aromatic ring may be substituted with a fluorine atom, a chlorine atom, a methyl group, a trifluoromethyl group, a methoxy group, a phenoxy group or a thiophenyl group; and $R^{11}$ to $R^{13}$ each independently represent either a phenyl group, a naphthyl group or a biphenyl group in which a part or all of hydrogen atoms on an aromatic ring may be substituted with a methyl group, a trifluoromethyl group, a methoxy group, a phenoxy group, a thiophenyl group, a fluorine atom or a chlorine atom.

The above photoacid generator has, because of its molecular structure, sensitivity to ultraviolet rays such as g-ray, h-ray, i-ray and those irradiated from a KrF excimer laser (wavelength: 248 nm) and an ArF excimer laser (wavelength:

193 nm) and thus generates an acid by irradiation with such an ultraviolet ray so as to change the irradiated portions of the resist film to be soluble in the developer. By the use of this photoacid generator in the positive-type resist composition, the irradiated portions of the resist film are made soluble in the developer under the action of the acid generated by exposure to ultraviolet irradiation for the formation of the resist pattern.

5. Other Additives

It is feasible to contain any other additive or additives, as needed, in the positive-type resist composition of the present invention in addition to the polymer, the vinyl compound and the photoacid generator. Examples of the additives are a surfactant and a basic compound. These additives can be used in order to improve the film forming property or storage stability of the positive-type resist composition.

As the surfactant, there can be used a commercially available surfactant so as to obtain improvements in the application property, defoaming property, leveling property etc. of the resist composition.

Specific examples of the surfactant are those available under the trade names of e.g. "MEGAFACE, product number: F142D, F172, F183" from DIC Corporation, "FLUORAD, product number: FC-135, FC-170C, FC-430, FC-431" from Sumitomo SM Limited, "SURFLON, product number: S-112, S-113, S-131, S-141, S-145" from Asahi Glass Co., Ltd. and "SH-28A", "SH-190", "SH-193", "SZ-6032" and SF-8428" from Toray Dow Corning Co., Ltd. The amount of the surfactant contained in the resist composition is generally 5 parts by mass or less relative to 100 parts by mass of the polymer.

As the basic compound, there can be used a nitrogen-containing organic compound in the positive-type resist composition so as to limit the diffusion of the acid during the exposure of the resist film for improvements in resolution, exposure margin and pattern profile of the resist pattern and to increase the stability of the vinyl compound.

The nitrogen-containing organic compound can be, for example, a primary, secondary or tertiary aliphatic amine, a nitrogen-containing compound having a hydroxy group, an amide, an imide or a carbamate.

Specific examples of the primary aliphatic amine include methylamine, ethylamine, propylamine, butylamine, isobutylamine, tert-butylamine, pentylamine, isopentylamine, tert-pentylamine, hexylamine, cyclohexylamine, octylamine, methylenediamine and ethylenediamine.

Specific examples of the secondary aliphatic amine include dimethylamine, diethylamine, dipropylamine, diisopropylamine, dibutylamine, diisobutylamine, dipentylamine, dihexylamine, dicyclohexylamine, dioctylamine, N,N'-dimethylmethylenediamine and N,N'-diethylethylenediamine.

Specific examples of the tertiary aliphatic amine include trimethylamine, triethylamine, tripropylamine, triisopropylamine, tributylamine, triisobutylamine, tripentylamine, trihexylamine, tricyclohexylamine, butyldimethylamine, diisopropylethylamine, N,N,N',N'-tetramethylmethylenediamine and N,N,N',N'-tetramethylethylenediamine.

Specific examples of the nitrogen-containing compound with the hydroxy group include monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 1-[2-(2-hydroxyethoxy)ethyl]piperazine, piperidineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidineethanol, 1-aziridineethanol, N-(2-hydroxyethyl)phthalimide and N-(2-hydroxyethyl)isonicotinamide.

Specific examples of the amide include formamide, N-methylformamide, N,N-dimethylformamide, acetamide, N-methylacetamide, N,N-dimethylacetamide and propioneamide.

Specific examples of the imide include phthalimide and succinimide.

Specific examples of the carbamate include N-tert-butoxycarbonyl-N,N-dicyclohexylamine.

6. Use of Positive-Type Resist Composition

The positive-type resist composition is used in the form of a resist solution so as to form a resist pattern on a substrate. It is feasible to form the resist pattern on the substrate by applying the resist composition to the substrate, heating and drying the resulting resist film, thermally curing the resist film, exposing the cured resist film and developing the exposed resist film with a developer.

The positive-type resist composition can be applied to the substrate by a wet application process with the use of a bar coater, a spin coater or a roll coater.

Subsequent to the application, the resist film of the positive-type resist composition is subjected to heat treatment in order to remove the solvent from the positive-type resist composition and, at the same time, promote the bonding of the polymer and the vinyl compound in the positive-type resist composition and sufficiently cure the resist film. The heat treatment can be performed by a known process such as heating on a hot plate. The heat treatment temperature is generally 60 to 150° C., preferably 80 to 140° C. If the heat treatment temperature is lower than 60° C. or is higher than 150° C., the resist film may not be cured sufficiently so that there arises a possibility of poor dissolution contrast of the resist pattern due to less difference in developer solubility between exposed and unexposed portions of the resist film, wetting of the resist pattern in the organic solvent after the development etc. The heat treatment time is generally 30 seconds or longer, preferably 1 minute or longer. If the heat treatment time is shorter than 30 seconds, the resist film may not be cured sufficiently so that there arises a possibility of poor dissolution contrast of the resist pattern due to less difference in developer solubility between exposed and unexposed portions of the resist film, wetting or swelling of the resist pattern by the organic solvent after the development etc.

The resist film of the positive-type resist composition can be exposed by a known process through a patterned photomask with the use of a light source such as a low-pressure mercury lamp, a high-pressure mercury lamp, an ultrahigh-pressure mercury lamp, a KrF excimer laser (wavelength: 248 nm) or an ArF excimer laser (wavelength: 193 nm). It is preferable to perform the exposure in such a manner that the amount of exposure is the order of 1 to 10000 $mJ/cm^2$, more preferably 10 to 5000 $mJ/cm^2$.

After the exposure, the resist film can be developed as it is. Alternatively, the resist film may be subjected to heat treatment before the development in order to promote the decomposition of the polymer under the action of the acid generated from the photoacid generator in the exposed portions of the resist film. The heat treatment can be performed by a known process such as heating on a hot plate. The heat treatment temperature is generally 140° C. or lower, preferably 130° C. or lower. If the heat treatment temperature is higher than 140° C., the polymer of the resist composition may be thermally degraded so that there arises a possibility of poor contrast of the resist pattern due to less difference in developer solubility, wetting or swelling of the resist pattern by the organic solvent after the development etc.

It is preferable to develop the exposed resist film by a known process such as immersion process, paddle process or spraying process, with the use of an aqueous alkaline solution of e.g. 2 to 3 mass % tetramethylammonium hydroxide as the developer, in a development time of 0.1 to 3 minutes, more preferably 0.5 to 2 minutes. By this development process, the target resist pattern can be formed on the substrate.

EXAMPLES

The present invention will be described in more detail below by way of the following examples. It should be noted that the following examples are illustrative and are not intended to limit the present invention thereto.

1. Influence of Fluorine-Containing Aliphatic Alcohols on Organic Polymer Substrates The immersion test of organic polymer substrates in various solvents was conducted as follows.

The organic polymer substrates used were PET substrates cut out to a size of 5 cm×5 cm from a PET film of 100 μm thickness (available under the trade name of "LUMIRROR T60" from Toray Industries, Inc.) by a cutter knife.

The solvents used were 2,2,3,3-tetrafluoro-1-propanol, 2,2,3,4,4,4-hexafluoro-1-butanol, 2,2,3,3,4,4,5,5-octafluoro-1-pentanol as monohydric $C_2$-$C_8$ alcohols in each of which the number of hydrogen atoms was equal to or less than the number of nitrogen atoms. As comparative solvents, propylene glycol monomethyl ether, propylene glycol monomethyl ether acetate and cyclohexanone were used.

In the immersion test, the solvents were poured into petri dishes, respectively. The PET substrates were then totally immersed in the respective solvents for 120 seconds and dried on a hot plate at 100° C. After that, the PET substrates were tested for the occurrence or non-occurrence of warpage due to swelling by the solvent. Further, the haze values of the PET substrates were measured with a haze meter (model name: "NDH200" available from Nippon Denshoku Industries Co., Ltd.). The measurement of the haze value was carried out according to JIS K 7136. Before the immersion test, there was no warpage in the PET substrate; and the haze value of the PET substrate was 2.0%

As shown in TABLE 1, there was no warpage in the PET substrate after the immersion of the PET substrate in the fluorine-containing aliphatic alcohol such as 2,2,3,3-tetrafluoro-1-propanol, 2,2,3,4,4,4-hexafluoro-1-butanol or 2,2,3,3,4,4,5,5-octafluoro-1-pentanol. There was almost no change in the haze value of the PET substrate before and after the immersion test. In the case of immersing the PET substrate in ropylene glycol monomethyl ether, propylene glycol monomethyl ether acetate or cyclohexanone as the solvent, however, warpage occurred in the PET substrate due to swelling of the PET substrate by the solvent. In the case of immersing the PET substrate in cyclohexanone, the PET substrate was turned whitish so that the haze value of the PET substrate was largely increased to 3.8%. It has been shown by these results that the fluorine-containing aliphatic alcohols such as 2,2,3,3-tetrafluoro-1-propanol, 2,2,3,4,4,4-hexafluoro-1-butanol and 2,2,3,3,4,4,5,5-octafluoro-1-pentanol does not cause swelling and surface erosion of the PET substrate.

TABLE 1

| Solvent | Warpage | Haze value |
| --- | --- | --- |
| 2,2,3,3-Tetrafluoro-1-propanol | Not occurred | 1.8% |
| 2,2,3,4,4,4-Hexafluoro-1-butanol | Not occurred | 1.8% |

TABLE 1-continued

| Solvent | Warpage | Haze value |
| --- | --- | --- |
| 2,2,3,3,4,4,5,5-Octafluoro-1-pentanol | Not occurred | 1.8% |
| Propylene glycol monomethyl ether | Occurred | 1.8% |
| Propylene glycol monomethyl ether acetate | Occurred | 1.9% |
| Cyclohexanone | Occurred | 3.8% |

2. Synthesis of Monomer by Monomer Acetalization Method

Synthesis Example

Synthesis of 1-(2-Methylpropoxy)ethyl Methacrylate

Into a 50-mL eggplant-shaped flask, 8.61 g (100 mmol) of methacrylic acid and 20.0 g (200 mmol) of isobutyl vinyl ether were placed. A fluorine resin-coated stirring piece was dropped into the flask. The mixed solution inside the flask was heated for 6 hours by immersing the flask in an oil bath whose temperature was controlled to 60° C. while stirring the mixed solution by the stirring piece with the use of a magnetic stirrer. After the heating, the whole of the mixed solution was mixed with 20 ml of aqueous sodium hydrogencarbonate solution (concentration: 5 wt %). The resulting mixed solution was left still and separated into an organic phase and an aqueous phase. The organic phase was extracted, dried with sodium sulfate to remove therefrom moisture content, and then, filtrated. The thus-obtained filtrate was concentrated under the conditions of a temperature of 40° C. and a pressure of 30 hPa by a rotary evaporator. By this, 12.32 g of 1-(2-methylpropoxy)ethyl methacrylate of the following formula was obtained in the form of a pale yellow liquid as a protected carboxyl-containing monomer for providing a repeating unit B2 in a polymer.

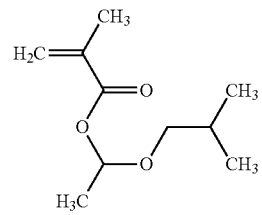

3. Synthesis of Polymers

Next, polymers for positive-type resist compositions were synthesized. Each of the polymers was tested for the molecular weight and the solubility in fluorine-containing aliphatic alcohol solvents.

As raw material monomers for the synthesis of the polymers, monomers providing repeating units A, B1 and B2 and any repeating unit other than the repeating units A, B1 and B2 in the polymers are shown TABLES 2 to 5, respectively. The raw material monomers are hereinafter designated by the respective abbreviation codes of TABLES 2 to 5.

TABLE 2

| Abbreviation code | Compound name of raw material monomer |
|---|---|
| MA-nBu | Butyl methacrylate |
| MA-iBu | Isobutyl methacrylate |
| MA-EOE | 2-Ethoxyethyl methacrylate |
| MA-Me | Methyl methacrylate |
| MA-MIB-HFA | 1,1,1-Trifluoro-2-hydroxy-6-methyl-2-(trifluoromethyl)heptane-4-yl methacrylate |
| HFIP-M | 1,1,1,3,3,3-Hexafluoropropane-2-yl methacrylate |
| MA-BTHB-OH | 1,1,1-Trifluoro-2-hydroxy-2-(trifluoromethyl)pentane-4-yl methacrylate |
| TFOL-M | 2,2,2-Trifluoroethyl methacrylate |
| MA-HE | 2-Hydroxyethyl methacrylate |

TABLE 3

| Abbreviation code | Compound name of raw material monomer |
|---|---|
| AA | Acrylic acid |
| MAA | Methacrylic acid |
| MA-EATf | 2-(N-Trifluoromethylsulfonyl)aminoethyl methacrylate |

TABLE 4

| Abbreviation code | Compound name of raw material monomer |
|---|---|
| MAA-iBuVE | 1-(2-Methylpropoxy)ethyl methacrylate |

TABLE 5

| Abbreviation code | Compound name of raw material monomer |
|---|---|
| MA-CH | Cyclohexyl methacrylate |
| MA-DEAE | 2-(N,N-Diethylamino)ethyl methacrylate |

Further, commercially available dimethyl 2,2'-azobis(2-methylpropionate) (product number: V-601 from Wako Pure Chemical Industries, Ltd.) was used as a polymerization initiator (hereinafter referred to as "V-601"); and 2-butanone was used as a reaction solvent.

Examples 1 to 14 refer to the synthesis of the polymers falling within the scope of the present invention, whereas Comparative Examples 1 to 4 refer to the synthesis of the polymers out of the scope of the present invention. Herein, each of the polymers is designated by its initial letter "P" with the abbreviation codes of the raw material monomers indicated within the parentheses. The polymer is thus abbreviated as "P(monomer code/monomer code)" such as, for example, P(MA-nBu/MAA). The repeating unit in which an acetal bond was formed between a MAA-derived repeating unit and 3,4-dihydro-2H-pyrane is referred to as MA-DHP.

Example 1

Synthesis of P(MA-nBu/MAA) 80/20 (Molar Ratio)

As the polymer, P(MA-nBu/MAA)=80/20 (molar ratio) was synthesized as follows such that the composition ratio (molar ratio) of the repeating units A/B1 was 80/20.

Into a 30-ml vial with a septum plug, 1.737 g (12.2 mmol) of MA-nBu, 0.263 g (3.05 mmol) of MAA, 4.00 g of 2-butanone and 0.176 g (0.763 mmol) of V-601 were placed. A fluorine resin-coated stirring piece was dropped into the vial. The vial was sealed after introducing nitrogen into the vial. The mixed solution inside the vial was then heated for 5 hours by immersing the vial in an oil bath whose temperature was controlled to 80° C. while stirring the mixed solution by the stirring piece with the use of a magnetic stirrer. After the heating, the whole of the mixed solution was mixed with 40 g of n-heptane to thereby form a precipitate. The thus-formed solid precipitate was recovered by suction filtration and dried for 8 hours in a vacuum drier of 75° C. By this, the target polymer P(MA-nBu/MAA) of the following formula was obtained in the form of a white solid substance with a ratio of MA-nBu/MAA=80/20 (molar ratio). The yield of the target polymer was 1.66 g, i.e., 83% relative to the raw material monomers.

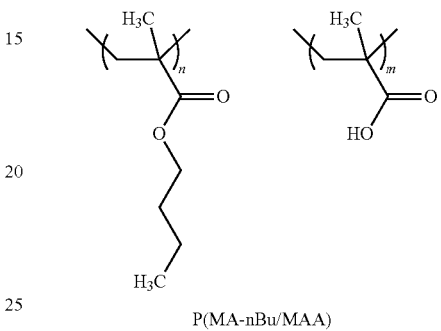

P(MA-nBu/MAA)

In the above formula, n and m each represent a positive integer.

Example 2

Synthesis of P(MA-nBu/MAA) 70/30 (Molar Ratio)

As the polymer, P(MA-nBu/MAA)=70/30 (molar ratio) was synthesized such that the composition ratio (molar ratio) of the repeating units A/B1 was 70/30. The synthesis of the target polymer P(MA-nBu/MAA) was performed, in the same manner as in Example 1, using 1.588 g (11.2 mmol) of MA-nBu, 0.412 g (4.79 mmol) of MAA, 4.00 g of butanone and 0.184 g (0.798 mmol) of V-601. The target polymer P(MA-nBu/MAA) was obtained in the form of a white solid substance with a ratio of MA-nBu/MAA=70/30 (molar ratio). The yield of the target polymer was 1.79 g, i.e., 90% relative to the raw material monomers.

Example 3

Synthesis of P(MA-iBu/MAA) 70/30 (Molar Ratio)

As the polymer, P(MA-iBu/MAA)=70/30 (molar ratio) was synthesized such that the composition ratio (molar ratio) of the repeating units A/B1 was 70/30. The synthesis of the target polymer P(MA-iBu/MAA) of the following formula was performed, in the same manner as in Example 1, using 1.588 g (11.2 mmol) of MA-iBu, 0.412 g (4.79 mmol) of MAA, 4.00 g of 2-butanone and 0.184 g (0.798 mmol) of V-601. The target polymer P(MA-iBu/MAA) was obtained in the form of a white solid substance with a ratio of MA-iBu/MAA=70/30 (molar ratio). The yield of the target polymer was 1.95 g, i.e., 98% relative to the raw material monomers.

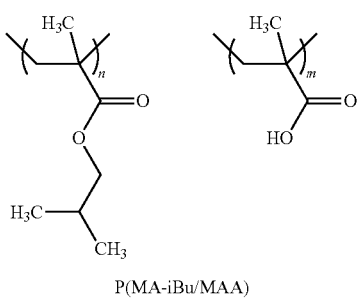

P(MA-iBu/MAA)

In the above formula, n and m each represent a positive integer.

Example 4

Synthesis of P(MA-EOE/MAA) 70/30 (Molar Ratio)

As the polymer, P(MA-EOE/MAA)=70/30 (molar ratio) was synthesized such that the composition ratio (molar ratio) of the repeating units A/B1 was 70/30. The synthesis of the target polymer P(MA-EOE/MAA) of the following formula was performed, in the same manner as in Example 1, using 1.622 g (10.3 mmol) of MA-EOE, 0.378 g (4.39 mmol) of MAA, 4.00 g of 2-butanone and 0.169 g (0.732 mmol) of V-601. The target polymer P(MA-EOE/MAA) was obtained in the form of a white solid substance with a ratio of MA-EOE/MAA=70/30 (molar ratio). The yield of the target polymer was 1.90 g, i.e., 95% relative to the raw material monomers.

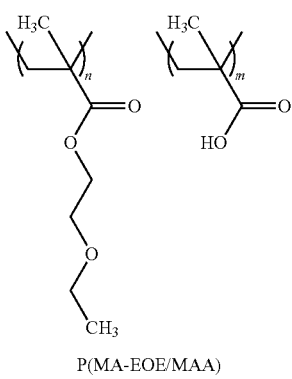

P(MA-EOE/MAA)

In the above formula, n and m each represent a positive integer.

Example 5

Synthesis of P(MA-EOE/MAA) 50/50 (Molar Ratio)

As the polymer, P(MA-EOE/MAA)=50/50 (molar ratio) was synthesized such that the composition ratio (molar ratio) of the repeating units A/B1 was 50/50. The synthesis of the target polymer P(MA-EOE/MAA) was performed, in the same manner as in Example 1, using 1.295 g (8.19 mmol) of MA-EOE, 0.705 g (8.19 mmol) of MAA, 4.00 g of 2-butanone and 0.189 g (0.819 mmol) of V-601. The target polymer P(MA-EOE/MAA) was obtained in the form of a white solid substance with a ratio of MA-EOE/MAA=70/30 (molar ratio). The yield of the target polymer was 1.96 g, i.e., 98% relative to the raw material monomers.

Example 6

Synthesis of P(MA-Me/MAA) 70/30 (Molar Ratio)

As the polymer, P(MA-Me/MAA)=70/30 (molar ratio) was synthesized such that the composition ratio (molar ratio) of the repeating units A/B1 was 70/30. The synthesis of the target polymer P(MA-Me/MAA) of the following formula was performed, in the same manner as in Example 1, using 0.539 g (6.26 mmol) of MAA, 1.461 g (14.6 mmol) of MA-Me, 4.00 g of 2-butanone and 0.240 g (1.04 mmol) of V-601. The target polymer P(MA-Me/MAA) was obtained in the form of a white solid substance with a ratio of MA-Me/MAA=70/30 (molar ratio). The yield of the target polymer was 1.90 g, i.e., 95% relative to the raw material monomers.

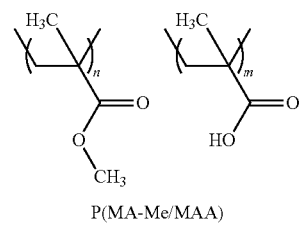

P(MA-Me/MAA)

In the above formula, n and m each represent a positive integer.

Example 7

Synthesis of P(TFOL-M/MAA) 70/30 (Molar Ratio)

As the polymer, P(TFOL-M/MAA)=70/30 (molar ratio) was synthesized such that the composition ratio (molar ratio) of the repeating units A/B1 was 70/30. The synthesis of the target polymer P(TFOL-M/MAA) of the following formula was performed, in the same manner as in Example 1, using 1.640 g (9.76 mmol) of TFOL-M, 0.360 g (4.18 mmol) of MAA, 4.00 g of 2-butanone and 0.160 g (0.697 mmol) of V-601. The target polymer P(TFOL-M/MAA) was obtained in the form of a white solid substance with a ratio of TFOL-M/MAA=70/30 (molar ratio). The yield of the target polymer was 1.96 g, i.e., 98% relative to the raw material monomers.

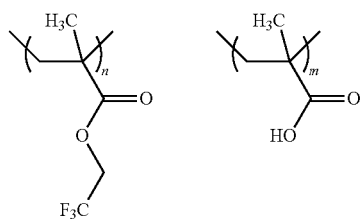

P(TFOL-M/MAA)

In the above formula, n and m each represent a positive integer.

Example 8

Synthesis of P(MA-nBu/MA-EATf) 70/30 (Molar Ratio)

As the polymer, P(MA-nBu/MA-EATf)=70/30 (molar ratio) was synthesized such that the composition ratio (molar ratio) of the repeating units A/B1 was 70/30. The synthesis of the target polymer P(MA-nBu/MA-EATf) of the following formula was performed, in the same manner as in Example 1, using 1.119 g (7.87 mmol) of MA-nBu, 0.881 g (3.37 mmol) of MA-EATf, 4.00 g of 2-butanone and 0.129 g (0.562 mmol) of V-601. The target polymer P(MA-nBu/MA-EATf) was obtained in the form of a white solid substance with a ratio of TFOL-M/MAA=70/30 (molar ratio). The yield of the target polymer was 1.50 g, i.e., 75% relative to the raw material monomers.

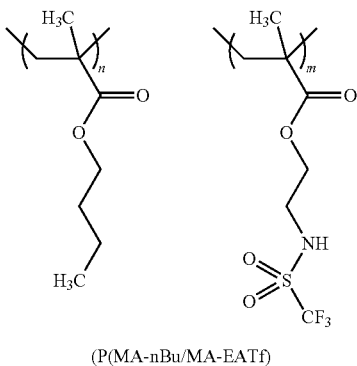

(P(MA-nBu/MA-EATf))

In the above formula, n and m each represent a positive integer.

Example 9

Synthesis of P(HFIP-M/MA-EATf) 60/40 (Molar Ratio)

As the polymer, P(HFIP-M/MA-EATf)=60/40 (molar ratio) was synthesized such that the composition ratio (molar ratio) of the repeating units A/B1 was 60/40. The synthesis of the target polymer P(HFIP-M/MA-EATf) of the following formula was performed, in the same manner as in Example 1, using 0.849 g (3.25 mmol) of MA-EATf, 1.151 g (4.87 mmol) of HFIP-M, 4.00 g of 2-butanone and 0.094 g (0.41 mmol) of V-601. The target polymer P(MA-nBu/MA-EATf) was obtained in the form of a white solid substance with a ratio of TFOL-M/MAA=70/30 (molar ratio). The yield of the target polymer was 1.50 g., i.e., 75% relative to the raw material monomers.

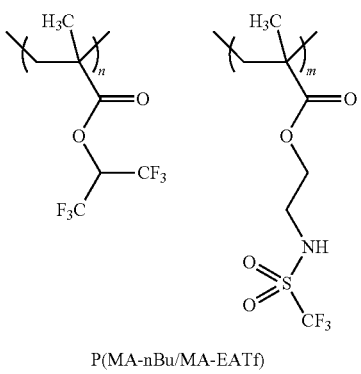

P(MA-nBu/MA-EATf)

In the above formula, n and m each represent a positive integer.

Example 10

Synthesis of P(MA-MIB-HFA/MA-EATf) 70/30 (Molar Ratio)

As the polymer, P(MA-MIB-HFA/MA-EATf)=70/30 (molar ratio) was synthesized such that the composition ratio (molar ratio) of the repeating units A/B1 was 70/30. The synthesis of the target polymer P(MA-MIB-HFA/MA-EATf) of the following formula was performed, in the same manner as in Example 1, using 0.500 g (1.91 mmol) of MA-EATf, 1.500 g (4.46 mmol) of MA-MIB-HFA, 4.00 g of 2-butanone and 0.073 g (0.32 mmol) of V-601. The target polymer P(MA-MIB-HFA/MA-EATf) was obtained in the form of a white solid substance with a ratio of MA-MIB-HFA/MA-EATf=70/30 (molar ratio). The yield of the target polymer was 0.90 g, i.e., 45% relative to the raw material monomers.

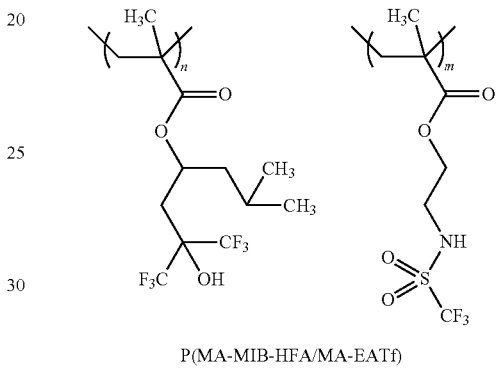

P(MA-MIB-HFA/MA-EATf)

In the above formula, n and m each represent a positive integer.

Example 11

Synthesis of P(MA-MIB-HFA/MA-EATf) 60/40 (Molar Ratio)

As the polymer, P(MA-MIB-HFA/MA-EATf)=60/40 (molar ratio) was synthesized such that the composition ratio (molar ratio) of the repeating units A/B1 was 60/40. The synthesis of the target polymer P(MA-MIB-HFA/MA-EATf) of the following formula was performed, in the same manner as in Example 1, using 1.318 g (3.92 mmol) of MA-MIB-HFA, 0.682 g (2.61 mmol) of MA-EATf, 4.00 g of 2-butanone and 0.075 g (0.33 mmol) of V-601. The target polymer P(MA-MIB-HFA/MA-EATf) was obtained in the form of a white solid substance with a ratio of MA-MIB-HFA/MA-EATf=60/40 (molar ratio). The yield of the target polymer was 1.64 g, i.e., 82% relative to the raw material monomers.

Example 12

Synthesis of P(MA-nBu/MA-iBuVE) 70/30 (Molar Ratio)

As the polymer, P(MA-nBu/MA-iBuVE)=70/30 (molar ratio) was synthesized as follows such that the composition ratio (molar ratio) of the repeating units A/B2 was 70/30.

Into a 50-ml eggplant-shaped flask, 3.203 g (22.5 mmol) of MA-nBu, 1.797 g (9.65 mmol) of MA-iBuVE, 10.0 g of 2-butanone and 0.370 g (1.61 mmol) of V-601 were placed. A fluorine resin-coated stirring piece was dropped into the flask.

The flask was sealed after introducing nitrogen into the flask. The mixed solution inside the flask was heated for 5 hours by immersing the flask in an oil bath whose temperature was controlled to 80° C. while stirring the mixed solution by the stirring piece with the use of a magnetic stirrer. After the heating, the whole of the mixed solution was concentrated under the conditions of a temperature of 40° C. and a pressure of 30 hPa by a rotary evaporator, and then, mixed with 200 g of methanol to thereby form a precipitate. The thus-formed solid precipitate was recovered by decantation and dried for 6 hours in a vacuum drier of 40° C. By this, the target polymer P(MA-nBu/MA-iBuVE) of the following formula was obtained in the form of a white solid substance with a ratio of MA-nBu/MAA=80/20 (molar ratio). The yield of the target polymer was 3.78 g, i.e., 76% relative to the raw material monomers.

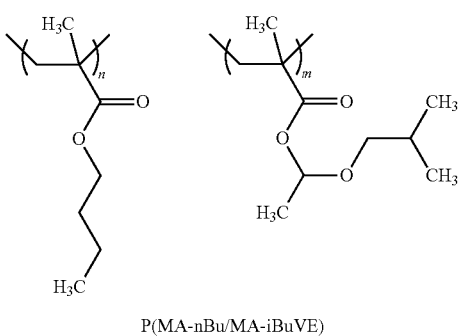

P(MA-nBu/MA-iBuVE)

In the above formula, n and m each represent a positive integer.

Example 13

Synthesis of P(MA-nBu/MA-DHP) 70/30 (Molar Ratio) by Polymer Acetalization Method As the polymer, P(MA-nBu/MA-DHP)=70/30 (molar ratio) was synthesized as follows such that the composition ratio (molar ratio) of the repeating units A/B2 was 70/30.

Into a 50-ml eggplant-shaped flask, 1.00 g of P(MA-nBu/MAA)=70/30 (molar ratio) obtained in the same manner as in Example 2, 0.30 g of 3,4-dihydro-2H-pyrane and 5.00 g of 2-butanone were placed. A fluorine resin-coated stirring piece was dropped into the flask. The mixed solution inside the flask was cooled to be 3° C. or lower by immersing the flask in an ice water bath while stirring the mixed solution by the stirring piece with the use of a magnetic stirrer. To this solution, a solution of 3 mg of methanesulfonic acid in 0.50 g of 2-buthanone were dropped over 15 minutes. The resulting mixed solution was stirred for 6 hours under cooling in the ice water bath. The mixed solution was then admixed with 10 g of MEK and with 10 mL of aqueous sodium hydrogencarbonate solution (concentration: 5 wt %), left still and separated into an organic phase and an aqueous phase. The organic phase was extracted, dried with sodium sulfate to remove therefrom moisture content, and then, filtrated. The thus-obtained filtrate was mixed with 70 g of n-heptane to thereby form a precipitate. The thus-formed solid precipitate was recovered by suction filtration and dried for 8 hours in a vacuum drier of 40° C. By this, the target polymer P(MA-nBu/MA-DHP) of the following formula was obtained in the form of a white solid substance with a ratio of MA-nBu/MA-DHP=70/30 (molar ratio). The yield of the target polymer was 0.64 g.

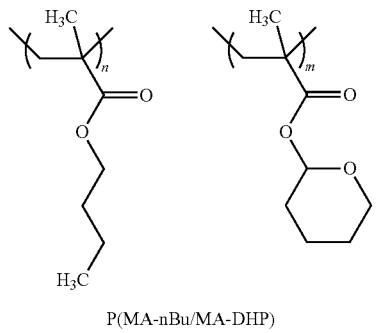

P(MA-nBu/MA-DHP)

In the above formula, n and m each represent a positive integer.

Example 14

Synthesis of P(MA-nBu/MAA/MA-iBuVE) 70/10/20 (Molar Ratio)

As the polymer, P(MA-nBu/MAA/MA-iBuVE)=70/10/20 (molar ratio) was synthesized such that the composition ratio (molar ratio) of the repeating units A/B1/B2 was 70/10/20. The synthesis of the target polymer P(MA-nBu/MAA/MA-iBuVE) of the following formula was performed, in the same manner as in Example 1, using 0.319 g (2.45 mmol) of MA-HE, 1.681 g (5.71 mmol) of MA-BTHB-OH, 4.00 g of 2-butanone and 0.253 g (0.357 mmol) of V-601. The target polymer P(MA-nBu/MAA/MA-iBuVE) was obtained in the form of a white solid substance with a ratio of MA-nBu/MAA/MA-iBuVE=70/10/20 (molar ratio). The yield of the target polymer was 1.58 g, i.e., 76% relative to the raw material monomers.

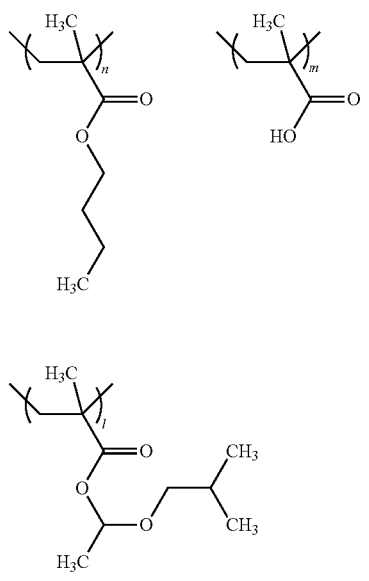

P(MA-nBu/MAA/MA-iBuVE)

In the above formula, n, m and l each represent a positive integer.

Comparative Example 1

Synthesis of P(MA-HE/MA-BTHB-OH) 30/70 (Molar Ratio)

As the polymer having only the repeating unit A, P(MA-HE/MA-BTHB-OH)=30/70 (molar ratio) was synthesized. The synthesis of the target polymer P(MA-HE/MA-BTHB-OH) of the following formula was performed, in the same manner as in Example 1, using 0.319 g (2.45 mmol) of MA-HE, 1.681 g (5.71 mmol) of MA-BTHB-OH, 4.00 g of 2-butanone and 0.094 g (0.41 mmol) of V-601. The target polymer P(MA-MIB-HFA/MA-EATf) was obtained in the form of a white solid substance with a ratio of MA-MIB-HFA/MA-EATf=30/70 (molar ratio). The yield of the target polymer was 1.76 g, i.e., 88% relative to the raw material monomers.

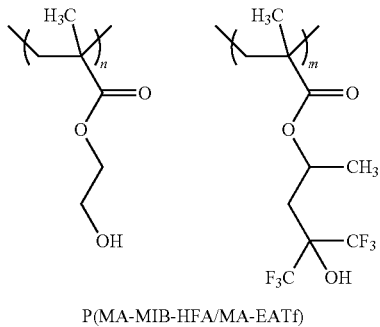

P(MA-MIB-HFA/MA-EATf)

In the above formula, n and m each represent a positive integer.

Comparative Example 2

Synthesis of P(MAA)

As the polymer having only the repeating unit B1, P(MAA) was synthesized. The synthesis of the target polymer P(MAA) of the following formula was performed, in the same manner as in Example 1, using 2.000 g (23.2 mmol) of MAA, 4.00 g of 2-butanone and 0.267 g (1.16 mmol) of V-601. The target polymer P(MAA) was obtained in the form of a white solid substance. The yield of the target polymer was 1.95 g, i.e., 98% relative to the raw material monomers.

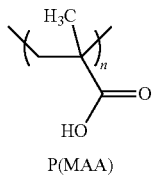

P(MAA)

In the above formula, n represents a positive integer.

Comparative Example 3

Synthesis of P(MA-CH/MAA) 70/30 (Molar Ratio)

As the polymer having the repeating unit B1 but not having the repeating unit A, P(MA-CH/MAA)=70/30 (molar ratio) was synthesized. The synthesis of the target polymer P(MA-CH/MAA) of the following formula was performed, in the same manner as in Example 1, using 1.640 g (9.75 mmol) of MA-CH, 0.360 g (4.18 mmol) of MAA, 4.00 g of 2-butanone and 0.160 g (0.70 mmol) of V-601. The target polymer P(MA-CH/MAA) was obtained in the form of a white solid substance with a ratio of MA-CH/MAA=70/30 (molar ratio). The yield of the target polymer was 1.54 g, i.e., 77% relative to the raw material monomers.

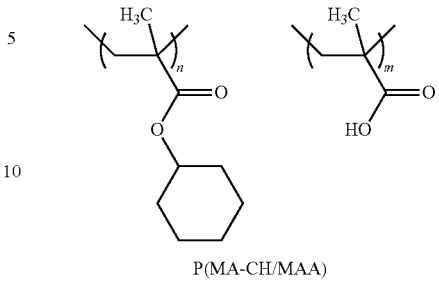

P(MA-CH/MAA)

In the above formula, n and m each represent a positive integer.

Comparative Example 4

Synthesis of P(MA-DEAE/MAA) 70/30 (Molar Ratio)

As the polymer having the repeating unit B1 but not having the repeating unit A, P(MA-DEAE/MAA)=70/30 (molar ratio) was synthesized. The synthesis of the target polymer P(MA-DEAE/MAA) of the following formula was performed, in the same manner as in Example 1, using 1.640 g (9.75 mmol) of MA-CH, 0.360 g (4.18 mmol) of MAA, 4.00 g of 2-butanone and 0.160 g (0.70 mmol) of V-601. The target polymer P(MA-DEAE/MAA) was obtained in the form of a white solid substance with a ratio of MA-DEAE/MAA=70/30 (molar ratio). The yield of the target polymer was 1.98 g, i.e., 99% relative to the raw material monomers.

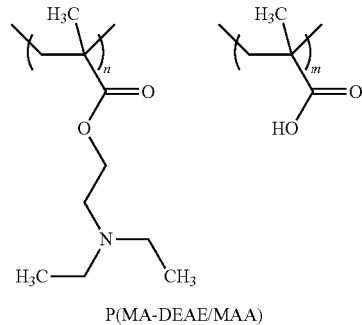

P(MA-DEAE/MAA)

In the above formula, n and m each represent a positive integer.

4. Measurement of Weight-Average Molecular Weights Mw and Molecular Weight Distributions Mw/Mn The weight-average molecular weights Mw and molecular weight distributions Mw/Mn (each obtained by division of the weight-average molecular weight Mw by the number-average molecular weight Mn) of the polymers of Examples 1 to 14 and Comparative Examples 1 to 4 were measured by gel permeation chromatography (GPC). The GPC measurement was herein carried out using a gel permeation chromatography system "HLC-8320" available from Tosoh Corporation, with a serial connection of columns (product names "ALPHA-M" and "ALPHA-2500") both available from Tosoh Corporation, as well as using a solution in which 0.03 mol/L of lithium bromide and 0.01 mol/L of phosphoric acid were dissolved in dimethylformamide as a carrier solvent and a refractive index detector. The results are shown in TABLE 6.

TABLE 6

| Polymer | | Monomer molar ratio | Mw | Mw/Mn |
|---|---|---|---|---|
| Example 1 | P(MA-nBu/MAA) | 80/20 | 11,200 | 3.0 |
| Example 2 | | 70/30 | 13,500 | 3.5 |
| Example 3 | P(MA-iBu/MAA) | 70/30 | 11,400 | 3.6 |
| Example 4 | P(MA-EOE/MAA) | 70/30 | 20,600 | 3.3 |
| Example 5 | | 50/50 | 15,600 | 4.3 |
| Example 6 | P(MA-Me/MAA) | 70/30 | 11,600 | 3.9 |
| Example 7 | P(TFOL-M/MAA) | 70/30 | 10,800 | 2.7 |
| Example 8 | P(MA-nBu/MA-EATf) | 70/30 | 14,800 | 3.4 |
| Example 9 | P(MA-HFIP/MA-EATf) | 60/40 | 11,200 | 2.8 |
| Example 10 | P(MA-MIB-HFA/MA-EATf) | 70/30 | 11,900 | 1.9 |
| Example 11 | | 60/40 | 19,000 | 2.4 |
| Example 12 | P(MA-nBu/MA-iBuVE) | 70/30 | 16,600 | 2.1 |
| Example 13 | P(MA-nBu/MA-DHP) | 70/30 | 16,100 | 2.5 |
| Example 14 | P(MA-nBu/MAA/MA-iBuVE) | 70/10/20 | 14,500 | 3.5 |
| Comparative Example 1 | P(MA-HE/MA-BTHB-OH) | 30/70 | 30,700 | 2.8 |
| Comparative Example 2 | P(MAA) | homo-polymer | 47,400 | 10.9 |
| Comparative Example 3 | P(MA-CH/MAA) | 70/30 | 15,900 | 4.8 |
| Comparative Example 4 | P(MA-DEAE/MAA) | 70/30 | 23,000 | 4.2 |

5. Evaluation of Solubility of Polymers in Fluorine-Containing Alcohol Solvents Each of the polymers of Examples 1 to 14 and Comparative Examples 1 to 4 was immersed in a fluorine-containing aliphatic alcohol solvent in such a manner that the concentration of the polymer in the solvent was 10 mass %. The resulting mixture was kept heated at 80° C. for 30 minutes, and then, stored in a refrigerator of 5° C. for 20 hours. After that, the solubility of the polymer was evaluated by visually checking the presence or absence of a deposit or insoluble substance. As the fluorine-containing aliphatic alcohol solvent, there were used three kinds of solvents: (A) 2,2,3,3-tetrafluoro-1-propanol, (B) 2,2,3,4,4,4-hexafluoro-1-butanol and (C) 2,2,3,3,4,4,5,5-octafluoro-1-pentanol. The results are shown in TABLE 7. The polymers of Examples 1 to 14 having the repeating unit A and the repeating unit B1 or B2 and the polymer of Comparative Example 1 having only the repeating unit A were soluble in the fluorine-containing aliphatic alcohols. By contrast, the polymer (P(MAA)) of Comparative Example 2 having only the repeating unit B1 and the polymers of Comparative Examples 3 and 4 each having the repeating unit B1 but not having the repeating unit A were insoluble in the fluorine-containing aliphatic alcohols.

TABLE 7

| Polymer | Polymer preparation | Molar ratio | Fluorine-containing aliphatic alcohol | | |
|---|---|---|---|---|---|
| | | | (A) | (B) | (C) |
| P(MA-nBu/MAA) | Example 1 | 80/20 | ○ | ○ | ○ |
| | Example 2 | 70/30 | ○ | ○ | ○ |
| P(MA-iBuMAA) | Example 3 | 70/30 | ○ | ○ | ○ |
| P(MA-EOE/MAA) | Example 4 | 70/30 | ○ | ○ | ○ |
| | Example 5 | 50/50 | ○ | ○ | ○ |
| P(MA-Me/MAA) | Example 6 | 70/30 | ○ | ○ | ○ |
| P(TFOL-M/MAA) | Example 7 | 70/30 | ○ | ○ | ○ |
| P(MA-nBu/MA-EATf) | Example 8 | 70/30 | ○ | ○ | ○ |
| P(MA-HFIP/MA-EATf) | Example 9 | 60/40 | ○ | ○ | ○ |

TABLE 7-continued

| Polymer | Polymer preparation | Molar ratio | Fluorine-containing aliphatic alcohol | | |
|---|---|---|---|---|---|
| | | | (A) | (B) | (C) |
| P(MA-MIB-HFA/MA-EATf) | Example 10 | 70/30 | ○ | ○ | ○ |
| | Example 11 | 60/40 | ○ | ○ | ○ |
| P(MA-nBu/MA-iBuVE) | Example 12 | 70/30 | ○ | ○ | ○ |
| P(MA-nBu/MA-DHP) | Example 13 | 70/30 | ○ | ○ | ○ |
| P(MA-nBu/MAA/MA-iBuVE) | Example 14 | 70/10/20 | ○ | ○ | ○ |
| P(MA-HE/MA-BTHB-OH) | Comparative Example 1 | 30/70 | ○ | ○ | ○ |
| P(MAA) | Comparative Example 2 | homo-polymer | X | X | X |
| P(MA-CH/MAA) | Comparative Example 3 | 70/30 | X | X | X |
| P(MA-DEAE/MAA) | Comparative Example 4 | 70/30 | X | X | X |

(A): 2,2,3,3-Tetrafluoro-1-propanol
(B): 2,2,3,4,4,4-Hexafluoro-1-butanol
(C): 2,2,3,3,4,4,5,5-Octafluoro-1-pentanol
○: The polymer was completely dissolved.
X: There remained some insoluble substance.

6. Thermal Curing of Polymers and Evaluation of Solubility of Polymers in Developer and in Organic Solvent Compositions were prepared by dissolving the polymers of Examples 1 to 14 and Comparative Example 1 in 2,2,3,3,4,4,5,5-octafluoro-1-pentanol as a fluorine-containing aliphatic alcohol solvent and adding thereto a trifunctional vinyl compound of the following formula (available under the trade name of "TMPEOTVE-30" from Nippon Carbide Industries Co., Inc., respectively. The concentration of the polymer and the concentration of the vinyl compound were in units of parts by mass relative to 100 parts by mass of the mass of the solvent.

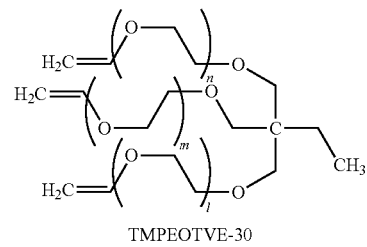

TMPEOTVE-30

In the above formula, n, m and l each represent a positive integer.

Further, silicon substrates were provided by cutting so as to have (001) crystal faces as substrate surfaces with natural oxidation films of 0.1 nm thickness formed thereon. The above compositions were applied to the respective silicon substrates with the use of a spin coater (model name: "1H-360S" available from Mikasa Co., Ltd.) by adjusting the rotation speed of the spin coater in such a manner that the thickness of the resulting coating film was in the range of 400 to 800 nm. The coated substrates were then heat treated in the air by a hot plate under the heat treatment conditions of TABLE 8, respectively. By this heat treatment, the coating films were thermally cured. After the thermal curing, the thicknesses of the coating films were measured with an optical interactive membrane thickness gauge (model name: "FTP500" available from Sentech Instruments, Germany).

In order to evaluate the developer resistance of the coating films, the coating films were immersed in an aqueous solution of 2.38 mass % tetramethylammonium hydroxide at 23° C. for 1 minute and washed with ion-exchanged water. The thicknesses of the coating films were again measured. In TABLE 7, the developer resistance was marked with: the symbol "○" when the thickness of the remaining coating film was 80% or more of the thickness of the coating film after the thermal curing; with the symbol "Δ" when the thickness of the remaining coating film was 60 to 80% or more of the thickness of the coating film after the thermal curing; and with the symbol "X" when the thickness of the remaining coating film was 60% or less of the thickness of the coating film after the thermal curing.

After immersing the coating films in the developer under the above conditions, the coating films were each spin coated with 2 ml of propylene glycol monomethyl ether ((D) in TABLE 8) or propylene glycol monomethyl ether acetate ((E) in TABLE 8) as a solvent and dried for 1 minute at 110° C. in order to evaluate the organic solvent resistance of the coating films. The solvent was herein applied with the use of a spin coater under the conditions of a rotation speed of 1200 rpm and a rotation retention time of 2 minutes. In TABLE 8, the solvent resistance was marked with: the symbol "○" when the thickness of the remaining coating film was 80% or more of the thickness of the coating film after the thermal curing; with the symbol "Δ" when the thickness of the remaining coating film was 60 to 80% or more of the thickness of the coating film after the thermal curing; and with the symbol "X" when the thickness of the remaining coating film was 60% or less of the thickness of the coating film after the thermal curing.

Japan Ltd. ((G) in TABLE 9) or "CP-100TF" from San-Apro Ltd. ((H) in TABLE 9)) as a photoacid generator at component ratios of TABLE 9, respectively. The component ratios were in units of parts by mass relative to 100 parts by mass of the mass of the solvent. The photoacid generator was used in an amount of 3 parts by mass relative to 100 parts by mass of the sum of the polymer and the vinyl compound.

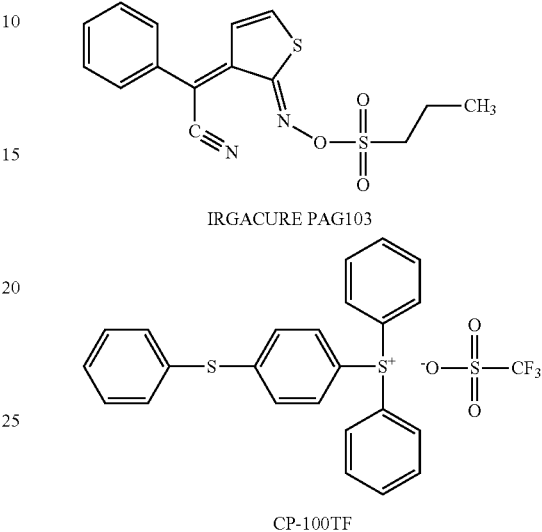

IRGACURE PAG103

CP-100TF

TABLE 8

| Polymer | Polymer preparation | Molar ratio | Polymer concentration | Vinyl compound concentration | Thermal curing conditions | Developer solubility | Solvent | Solvent resistance |
|---|---|---|---|---|---|---|---|---|
| P(MA-nBu/MAA) | Example 1 | 80/20 | 5.00 | 1.20 | 120° C./5 minutes | ○ | (D) | ○ |
|  | Example 2 | 70/30 | 5.03 | 1.87 | 120° C./5 minutes | ○ | (E) | ○ |
| P(MA-iBu/MAA) | Example 3 | 70/30 | 4.99 | 1.86 | 100° C./5 minutes | ○ | (E) | ○ |
| P(MA-EOE/MAA) | Example 4 | 70/30 | 5.00 | 1.71 | 110° C./5 minutes | ○ | (D) | ○ |
|  | Example 5 | 50/50 | 5.22 | 3.30 | 110° C./5 minutes | ○ | (D) | ○ |
| P(MA-Me/MAA) | Example 6 | 70/30 | 5.27 | 2.36 | 110° C./5 minutes | ○ | (E) | ○ |
| P(TFOL-M/MAA) | Example 7 | 70/30 | 4.87 | 1.13 | 100° C./10 minutes | ○ | (D) | ○ |
| P(MA-nBu/MA-EATf) | Example 8 | 70/30 | 5.33 | 1.23 | 120° C./15 minutes | ○ | (E) | ○ |
| P(MA-HFIP/MA-EATf) | Example 9 | 60/40 | 10.4 | 2.51 | 100° C./15 minutes | ○ | (D) | ○ |
| P(MA-MIB-HFA/ | Example 10 | 70/30 | 5.04 | 1.20 | 120° C./15 minutes | ○ | (D) | ○ |
| MA-EATf) | Example 11 | 60/40 | 5.26 | 1.00 | 120° C./15 minutes | ○ | (D) | ○ |
| P(MA-nBu/MA-iBuVE) | Example 12 | 70/30 | 4.80 | 1.45 | 120° C./15 minutes | ○ | (D) | ○ |
| P(MA-nBu/MA-DHP) | Example 13 | 70/30 | 4.80 | 1.52 | 120° C./15 minutes | ○ | (E) | ○ |
| P(MA-nBu/MAA/MA-iBuVE) | Example 14 | 70/10/20 | 4.80 | 1.31 | 120° C./15 minutes | ○ | (E) | ○ |
| P(MA-HEMA-BTHB-OH) | Comparative Example 1 | 30/70 | 5.00 | 2.00 | 120° C./15 minutes | X | (E) | X |

(D): propylene glycol monomethyl ether
(E): propylene glycol monomethyl ether acetate As shown in TABLE 8, the polymers of Examples 1 to 14 having the repeating units A and B were high in developer resistance and solvent resistance. By contrast, the polymer (P(MA-HE/MA-BTHB-OH)) of Comparative Example 1 having only the repeating unit A was poor in developer resistance and solvent resistance.

7. Pattern Formation Test

Positive-type resist compositions were prepared by dissolving, in 2,2,3,3,4,4,5,5-octafluoro-1-pentanol as a fluorine-containing aliphatic alcohol solvent, the polymers of Examples 1, 2, 4 to 6 and 10 to 14, TMPEOTVE-30 as a vinyl compound, a compound of the following formula (available under the trade name of "IRGACURE PAG103" from BASF Further, silicon substrates were provided by cutting so as to have (001) crystal faces as substrate surfaces with natural oxidation films of 0.1 nm thickness formed thereon. The above compositions were applied to the respective silicon substrates with the use of a spin coater (model name: "1H-360S" available from Mikasa Co., Ltd.) by adjusting the rotation speed of the spin coater in such a manner that the thickness of the resulting composition film was in the range of 400 to 800 nm. The coated substrates were then heat treated in the air by a hot plate under the heat treatment conditions of TABLE 9, respectively. By this heat treatment, the composition films were thermally cured. After the thermal curing, the thicknesses of the composition films on the silicon substrates were measured with an optical interactive membrane thickness gauge (model name: "FTP500" available from Sentech Instruments, Germany).

The thus-obtained positive-type resist composition-coated substrates were exposed to ultraviolet irradiation through the use of a g/h/i ray exposure machine (available from Süss Micro Tech, Germany) for 3 seconds, 10 seconds, 20 seconds and 60 seconds. The intensity of the ultraviolet irradiation was 70 mW. The exposure was performed with the use of a mask "FINELINE TESTPATTERN-I" available from Dai Nippon Printing Co., Ltd. After the exposure, the positive-type resist composition composition-coated substrates were heat treated by a hot plate at 90° C. for 1 minute, developed by immersion in a developer (aqueous solution of 2.38 mass % tetramethylammonium hydroxide) at 23° C. for 1 minute, washed with ion-exchanged water, and then, dried with the use of an air gun, respectively. The resulting resist patterns on the respective substrates were tested for the resolution. The resolution was evaluated as "satisfactory" when the resist pattern was resolved to a line-and-space pattern with a line width of 5 μm at any exposure amount. As shown in Figure 9, all of the resist patterns were formed with good resolution.

mW. After the exposure, the positive-type resist composition-coated substrates were heat treated by a hot plate at 90° C. for 1 minute, immersed in a developer (aqueous solution of 2.38 mass % tetramethylammonium hydroxide) at 23° C. for 1 minute to dissolve the resist films, washed with ion-exchanged water, and then, dried with the use of an air gun, respectively. The substrates were visually tested for the occurrence or non-occurrence of warpage due to swelling by the solvent. Further, the haze values of the respective substrates were measured with a haze meter.

As shown in TABLE 10, there occurred no warpage in any of the organic polymer substrates to which the positive-type resist compositions using the polymers of Examples 1 to 14 were applied. There was almost no change in the haze value of each of the organic polymer substrates before and after the application test. It has thus been shown by these results that, even when the positive-type resist composition is applied to the PET substrate, the PET substrate does not face a problem of transparency loss, shrinkage, surface erosion etc. due to swelling or dissolution by the solvent.

TABLE 9

| Polymer: molar ratio | Polymer preparation | Photoacid generator | Polymer concentration | Vinyl compound concentration | Heat treatment conditions | Resolution |
|---|---|---|---|---|---|---|
| P(MA-nBu/MAA) 80/20 | Example 1 | (G) | 4.26 | 1.27 | 110° C./5 minutes | Satisfactory |
| P(MA-nBu/MAA) 70/30 | Example 2 | (H) | 4.26 | 1.91 | 110° C./5 minutes | Satisfactory |
| P(MA-EOE/MAA) 70/30 | Example 4 | (H) | 4.72 | 1.41 | 110° C./5 minutes | Satisfactory |
| P(MA-EOE/MAA) 50/50 | Example 5 | (G) | 5.04 | 1.20 | 110° C./5 minutes | Satisfactory |
| P(MA-Me/MAA) 70/30 | Example 6 | (G) | 5.34 | 2.39 | 110° C./5 minutes | Satisfactory |
| P(MA-MIB-HFA/MA-EATf) 70/30 | Example 10 | (G) | 4.98 | 0.68 | 100° C./15 minutes | Satisfactory |
| P(MA-MIB-HFA/MA-EATf) 60/40 | Example 11 | (G) | 5.26 | 1.00 | 100° C./15 minutes | Satisfactory |
| P(MA-nBu/MA-iBuVE) 70/30 | Example 12 | (H) | 4.69 | 1.90 | 120° C./15 minutes | Satisfactory |
| P(MA-nBu/MA-DHP) 70/30 | Example 13 | (H) | 4.26 | 1.60 | 130° C./15 minutes | Satisfactory |
| P(MA-nBu/MAA/MA-iBuVE) 70/10/20 | Example 14 | (H) | 4.82 | 2.10 | 125° C./15 minutes | Satisfactory |

(G): IRGACURE PAG103
(H): CP-100TF
Satisfactory: The resist pattern was resolved to a line-and-space pattern with a line width of 5 μm.
Unsatisfactory: The resist pattern was not resolved satisfactorily.

8. Influence of Positive-Type Resist Composition on Organic Polymer Substrates The application test of the positive-type resist compositions using the polymers of Examples 1, 2, 4 to 6 and 10 to 14 as shown in TABLE 9 onto organic polymer substrates was conducted. The resist compositions were applied to the substrates and thermally cured in the same manner as in the above pattern formation test, except for using PET films as the organic polymer substrates in place of the silicon substrates. In each example, the heat treatment was performed under the same heat treatment conditions as in TABLE 9. The organic polymer substrates used were PET substrates cut out from a PET film of 100 μm thickness (available under the trade name of "LUMIRROR T60" from Toray Industries, Inc.) by a cutter knife into a circle of 12 cm diameter.

The thus-obtained positive-type resist composition-coated substrates were each exposed by irradiating the whole of the resist application surface of the substrate with ultraviolet irradiation through the use of a g/h/i ray exposure machine for 10 seconds. The intensity of the ultraviolet irradiation was 70

TABLE 10

| Polymer: molar ratio | Polymer preparation | Warpage | Haze value |
|---|---|---|---|
| P(MA-nBu/MAA) 80/20 | Example 1 | Not occurred | 2.1% |
| P(MA-nBu/MAA) 70/30 | Example 2 | Not occurred | 2.1% |
| P(MA-EOE/MAA) 70/30 | Example 4 | Not occurred | 2.0% |
| P(MA-EOE/MAA) 50/50 | Example 5 | Not occurred | 2.0% |
| P(MA-Me/MAA) 70/30 | Example 6 | Not occurred | 2.1% |
| P(MA-MIB-HFA/MA-EATf) 70/30 | Example 10 | Not occurred | 2.1% |
| P(MA-MIB-HFA/MA-EATf) 60/40 | Example 11 | Not occurred | 2.1% |
| P(MA-nBu/MA-iBuVE) 70/30 | Example 12 | Not occurred | 2.2% |

TABLE 10-continued

| Polymer: molar ratio | Polymer preparation | Warpage | Haze value |
|---|---|---|---|
| P(MA-nBu/MA-DHP) 70/30 | Example 13 | Not occurred | 2.2% |
| P(MA-nBu/MAA/MA-iBuVE) 70/10/20 | Example 14 | Not occurred | 2.1% |

As described above, the positive-type resist composition has a small influence on organic materials, such as less dissolution and swelling of the organic materials, and can form a resist film on an organic polymer substrate etc. by a wet application process such that the resulting resist film or resist pattern shows high solvent resistance.

Although the present invention has been described above with reference to the specific exemplary embodiments, the present invention is not limited to the above-described exemplary embodiments. Various modifications and variations of the embodiments described above can be made without departing from the scope of the present invention.

The invention claimed is:

1. A positive-type resist composition comprising:
   a fluorine-containing monohydric $C_2$-$C_8$ aliphatic alcohol in which the number of hydrogen atoms is equal to or less than the number of fluorine atoms;
   a polymer having a repeating unit A of the following general formula (1)

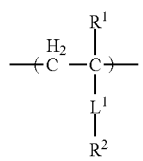

and a repeating unit B of the following general formula (2)

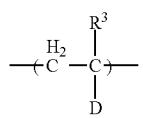

a vinyl compound; and
   a photoacid generator,
   wherein, in the general formula (1), $R^1$ represents a hydrogen atom, a fluorine atom, or a $C_1$-$C_3$ alkyl group in which a part or all of hydrogen atoms may be substituted with a fluorine atom or a chlorine atom;
   $R^2$ represents any of the following groups:

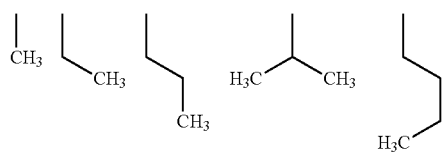

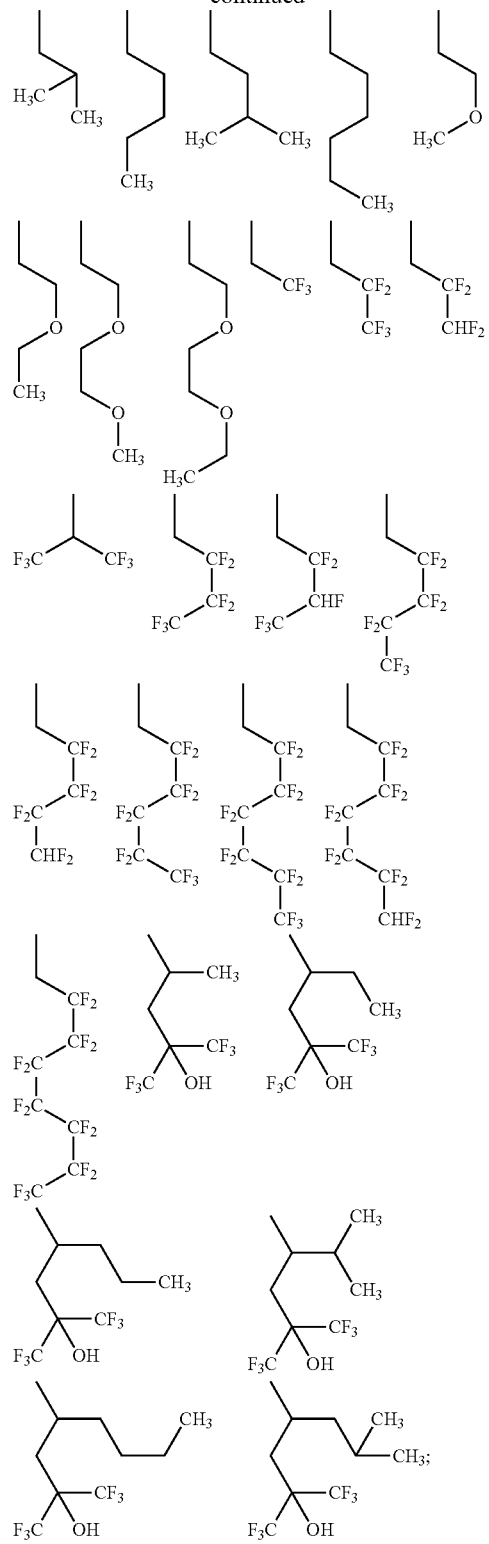

and
   $L^1$ represents a single bond, an oxygen atom, —$CH_2$—O—, —C(=O)—, —C(=O)—O— or —O—C(=O)—; and
   wherein, in the general formula (2), $R^3$ represents a hydrogen atom, a fluorine atom, or a $C_1$-$C_3$ alkyl group in which a part or all of hydrogen atoms may be substituted with a fluorine atom or a chlorine atom; and D is a group of the following general formula (6)

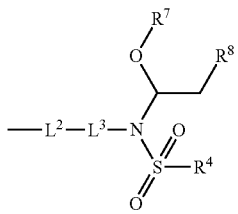

(6)

wherein $R^4$ represents a $C_1$-$C_8$ alkyl group in which a part or all of hydrogen atoms may be substituted with a fluorine atom or a chlorine atom;

$L^2$ represents a single bond, an oxygen atom, —$CH_2$—O—, —C(=O)—, —C(=O)—O— or —O—C(=O)—;

$R^7$ represents a $C_1$-$C_{15}$ straight, $C_3$-$C_{15}$ branched or $C_6$-$C_{15}$ cyclic hydrocarbon group in which a part or all of hydrogen atoms may be substituted with a fluorine atom or a chlorine atom;

$R^8$ represents a hydrogen atom, or a $C_1$-$C_{15}$ straight, $C_3$-$C_{15}$ branched or $C_6$-$C_{15}$ cyclic hydrocarbon group in which a part or all of hydrogen atoms may be substituted with a fluorine atom or a chlorine atom;

$R^7$ and $R^8$ may be bonded together to form a ring structure; and $L^3$ represents a single bond, or a $C_1$-$C_{15}$ straight or $C_3$-$C_{15}$ branched divalent hydrocarbon group in which a part of carbon atoms may be replaced by an oxygen atom and in which a part or all of hydrogen atoms may be substituted with a fluorine atom or a chlorine atom.

2. The positive-type resist composition according to claim 1, wherein the vinyl compound is a vinyl compound with at least two vinyl ether groups.

3. The positive-type resist composition according to claim 1, wherein the photoacid generator is a N-sulfonyloxyimide compound or oxime-O-sulfonate compound having a divalent group of the following general formula (7)

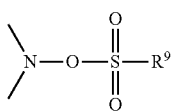

(7)

wherein $R^9$ represents a $C_1$-$C_{12}$ alkyl group in which a part or all of hydrogen atoms may be substituted with a fluorine atom, or either a phenyl group, a naphthyl group or a biphenyl group in which a part or all of hydrogen atoms on an aromatic ring may be substituted with a fluorine atom, a chlorine atom, a methyl group or a trifluoromethyl group; and two bonds of a nitrogen atom may be bonded to different atoms to form single bonds, respectively, or may be bonded to one atom to form a double bond.

4. The positive-type resist composition according to claim 1, wherein the photoacid generator is a compound of the following general formula (8)

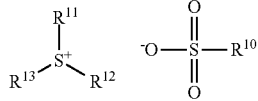

(8)

wherein $R^{10}$ represents a $C_1$-$C_{12}$ alkyl group in which a part or all of hydrogen atoms may be substituted with a fluorine atom, or either a phenyl group, a naphthyl group or a biphenyl group in which a part or all of hydrogen atoms on an aromatic ring may be substituted with a fluorine atom, a chlorine atom, a methyl group, a trifluoromethyl group, a methoxy group, a phenoxy group or a thiophenyl group; and $R^{11}$ to $R^{13}$ each independently represent either a phenyl group, a naphthyl group or a biphenyl group in which a part or all of hydrogen atoms on an aromatic ring may be substituted with a methyl group, a trifluoromethyl group, a methoxy group, a phenoxy group, a thiophenyl group, a fluorine atom or a chlorine atom.

5. The positive-type resist composition according to claim 1, wherein, assuming a mass of the fluorine-containing aliphatic alcohol as 100, the ratio of a mass of the polymer to the mass of the fluorine-containing alcohol is in a range of 0.5 to 30 and the ratio of a mass of the vinyl compound to the mass of the fluorine-containing aliphatic alcohol is in a range of 0.05 to 20; and wherein, assuming a total mass of the polymer and the vinyl compound as 100, the ratio of a mass of the photoacid generator to the total mass of the polymer and the vinyl compound is in a range of 0.01 to 15.

6. The positive-type resist composition according to claim 1, wherein the repeating unit A is contained in an amount of 25 to 80 mol % and the repeating unit B is contained in an amount of 20 to 75 mol % relative to the polymer.

7. A positive-type resist composition, comprising:
a fluorine-containing monohydric $C_2$-$C_8$ aliphatic alcohol in which the number of hydrogen atoms is equal to or less than the number of fluorine atoms;
a polymer having a repeating unit A of the following general formula (1)

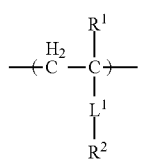

(1)

and a repeating unit B of the following general formula (2)

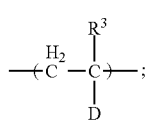

(2)

a vinyl compound; and
a photoacid generator, wherein, in the general formula (1), $R^1$ represents a hydrogen atom, a fluorine atom, or a $C_1$-$C_3$ alkyl group in which a part or all of hydrogen atoms may be substituted with a fluorine atom or a chlorine atom;

$R^2$ represents a $C_1$-$C_{15}$ straight or $C_3$-$C_{15}$ branched hydrocarbon group in which a part of carbon atoms may be replaced by an oxygen atom and in which a part or all of hydrogen atoms may be substituted with a fluorine atom or a chlorine atom; and $L^1$ represents a single bond, an oxygen atom, —$CH_2$—O—, —C(=O)—, —C(=O)—O— or —O—C(=O)— wherein, in the general formula (2), $R^3$ represents a hydrogen atom, a fluorine atom, or a $C_1$-$C_3$ alkyl group in which a part or all of hydrogen atoms may be substituted with a fluorine atom or a chlorine atom; and D represents a group of the following general formula (6)

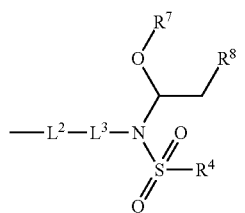

(6)

wherein $R^4$ represents a $C_1$-$C_8$ alkyl group in which a part or all of hydrogen atoms may be substituted with a fluorine atom or a chlorine atom;

$L^2$ represents a single bond, an oxygen atom, —$CH_2$—O—, —C(=O)—, —C(=O)—O— or —O—C(=O)—;

$R^7$ represents a $C_1$-$C_{15}$ straight, $C_3$-$C_{15}$ branched or $C_6$-$C_{15}$ cyclic hydrocarbon group in which a part or all of hydrogen atoms may be substituted with a fluorine atom or a chlorine atom;

$R^8$ represents a hydrogen atom, or a $C_1$-$C_{15}$ straight, $C_3$-$C_{15}$ branched or $C_6$-$C_{15}$ cyclic hydrocarbon group in which a part or all of hydrogen atoms may be substituted with a fluorine atom or a chlorine atom;

$R^7$ and $R^8$ may be bonded together to form a ring structure; and $L^3$ represents a single bond, or a $C_1$-$C_{15}$ straight or $C_3$-$C_{15}$ branched divalent hydrocarbon group in which a part of carbon atoms may be replaced by an oxygen atom and in which a part or all of hydrogen atoms may be substituted with a fluorine atom or a chlorine atom.

8. The positive-type resist composition according to claim 7, wherein the vinyl compound is a vinyl compound with at least two vinyl ether groups.

9. The positive-type resist composition according to claim 7, wherein the photoacid generator is a N-sulfonyloxyimide compound or oxime-O-sulfonate compound having a divalent group of the following general formula (7)

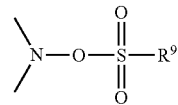

(7)

wherein $R^9$ represents a $C_1$-$C_{12}$ alkyl group in which a part or all of hydrogen atoms may be substituted with a fluorine atom, or either a phenyl group, a naphthyl group or a biphenyl group in which a part or all of hydrogen atoms on an aromatic ring may be substituted with a fluorine atom, a chlorine atom, a methyl group or a trifluoromethyl group; and two bonds of a nitrogen atom may be bonded to different atoms to form single bonds, respectively, or may be bonded to one atom to form a double bond.

10. The positive-type resist composition according to claim 7, wherein the photoacid generator is a compound of the following general formula (8)

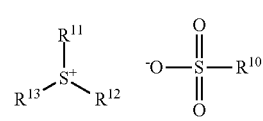

(8)

wherein $R^{10}$ represents a $C_1$-$C_{12}$ alkyl group in which a part or all of hydrogen atoms may be substituted with a fluorine atom, or either a phenyl group, a naphthyl group or a biphenyl group in which a part or all of hydrogen atoms on an aromatic ring may be substituted with a fluorine atom, a chlorine atom, a methyl group, a trifluoromethyl group, a methoxy group, a phenoxy group or a thiophenyl group; and $R^{11}$ to $R^{13}$ each independently represent either a phenyl group, a naphthyl group or a biphenyl group in which a part or all of hydrogen atoms on an aromatic ring may be substituted with a methyl group, a trifluoromethyl group, a methoxy group, a phenoxy group, a thiophenyl group, a fluorine atom or a chlorine atom.

11. The positive-type resist composition according to claim 7, wherein, assuming a mass of the fluorine-containing aliphatic alcohol as 100, the ratio of a mass of the polymer to the mass of the fluorine-containing alcohol is in a range of 0.5 to 30 and the ratio of a mass of the vinyl compound to the mass of the fluorine-containing aliphatic alcohol is in a range of 0.05 to 20; and wherein, assuming a total mass of the polymer and the vinyl compound as 100, the ratio of a mass of the photoacid generator to the total mass of the polymer and the vinyl compound is in a range of 0.01 to 15.

12. The positive-type resist composition according to claim 7, wherein the repeating unit A is contained in an amount of 25 to 80 mol % and the repeating unit B is contained in an amount of 20 to 75 mol % relative to the polymer.

* * * * *